United States Patent
Yan et al.

(10) Patent No.: US 12,415,885 B2
(45) Date of Patent: Sep. 16, 2025

(54) TERNARY BLEND ORGANIC SOLAR CELLS BASED ON ONE DONOR POLYMER AND TWO ACCEPTORS

(71) Applicant: THE HONG KONG UNIVERSITY OF SCIENCE AND TECHNOLOGY, Hong Kong (CN)

(72) Inventors: He Yan, Hong Kong (CN); Kui Jiang, Hong Kong (CN)

(73) Assignee: THE HONG KONG UNIVERSITY OF SCIENCE AND TECHNOLOGY, Hong Kong (CN)

(*) Notice: Subject to any disclaimer, the term of this patent is extended or adjusted under 35 U.S.C. 154(b) by 324 days.

(21) Appl. No.: 16/340,552

(22) PCT Filed: Oct. 11, 2017

(86) PCT No.: PCT/CN2017/105677
§ 371 (c)(1),
(2) Date: Apr. 9, 2019

(87) PCT Pub. No.: WO2018/068722
PCT Pub. Date: Apr. 19, 2018

(65) Prior Publication Data
US 2019/0229269 A1    Jul. 25, 2019

Related U.S. Application Data

(60) Provisional application No. 62/496,211, filed on Oct. 11, 2016.

(51) Int. Cl.
*C08G 61/12* (2006.01)
*C01B 32/152* (2017.01)
(Continued)

(52) U.S. Cl.
CPC .......... *C08G 61/126* (2013.01); *C01B 32/152* (2017.08); *H10K 30/30* (2023.02);
(Continued)

(58) Field of Classification Search
CPC ............... Y02E 10/549; H01L 51/0047; H01L 51/4253; H01L 51/0046; H01L 51/0034;
(Continued)

(56) References Cited

U.S. PATENT DOCUMENTS

2007/0062577 A1* 3/2007 Koppe .................... B82Y 10/00
                                                          136/263
2011/0315224 A1  12/2011 Choi et al.
2011/0315225 A1  12/2011 Choi et al.

FOREIGN PATENT DOCUMENTS

| CN | 101671428 A | 3/2010 |
| CN | 103050627 A | 4/2013 |
| CN | 104004165 A | 8/2014 |

OTHER PUBLICATIONS

Tang et al, Donor acceptor polymers based on 5,6-difluoro-benzo(1,2,5) thiadiazole for high performance solar cells, Mar. 2016.*

(Continued)

*Primary Examiner* — Michael Y Sun
(74) *Attorney, Agent, or Firm* — Nath, Goldberg & Meyer; Joshua B. Goldberg

(57) ABSTRACT

An organic solar cell comprises a photoactive layer that comprises at least one donor polymer and two non-fullerene molecular acceptors. Further, an organic solar cell comprises a photoactive layer that comprises one donor polymer, one fullerene acceptor, and one non-fullerene molecular acceptor. The donor polymer may exhibit temperature dependent aggregation (TDA) properties in solution, wherein the absorption onset of the polymer solution exhibits a red shift of at least 80 nm when the solution is cooled from 100° C.

(Continued)

to room temperature or the absorption onset of the polymer solution exhibits a red shift of at least 40 nm when the solution is cooled from 100° C. to 0° C.

2 Claims, 11 Drawing Sheets

(51) Int. Cl.
| | |
|---|---|
| *H10K 30/30* | (2023.01) |
| *H10K 30/80* | (2023.01) |
| *H10K 30/81* | (2023.01) |
| *H10K 71/12* | (2023.01) |
| *H10K 71/13* | (2023.01) |
| *H10K 85/10* | (2023.01) |
| *H10K 85/20* | (2023.01) |
| H10K 30/50 | (2023.01) |

(52) U.S. Cl.
CPC ............ *H10K 30/80* (2023.02); *H10K 30/81* (2023.02); *H10K 71/12* (2023.02); *H10K 71/135* (2023.02); *H10K 85/111* (2023.02); *H10K 85/113* (2023.02); *H10K 85/151* (2023.02); *H10K 85/215* (2023.02); *C08G 2261/1412* (2013.01); *C08G 2261/1426* (2013.01); *C08G 2261/146* (2013.01); *C08G 2261/149* (2013.01); *C08G 2261/3223* (2013.01); *C08G 2261/3243* (2013.01); *H10K 30/50* (2023.02); *Y02E 10/549* (2013.01)

(58) Field of Classification Search
CPC ...... H10K 85/215; H10K 30/30; H10K 30/80; H10K 30/81; H10K 71/12; H10K 71/135; H10K 85/111; H10K 85/113; H10K 85/151; H10K 30/50; C01B 32/152; C08G 61/126; C08G 2261/1412; C08G 2261/1426; C08G 2261/146; C08G 2261/149; C08G 2261/3223; C08G 2261/3243
See application file for complete search history.

(56) References Cited

OTHER PUBLICATIONS

Tong et al, Naphtho [1,2c:5,6c' . . . solar cells, Jun. 2017.*
Zang et al., integrated molecular . . . solar cells, 2014.*
Bin et al., Non-fullurene polymer solar cells . . . efficiency, Mar. 2016.*
Li et al., (Efficient Organic Solar Cells with Non-Fullerene Acceptors), Jul. 24, 2017, https://doi.org/10.1002/smll.201701120.*
Zhan et al., ("New Advances in non-fullerene Acceptor Based Organic Solar Cells", Oct. 2015.*
Zhao et al., ("Molecular Optimization Enables over 13% Efficiency in Organic Solar Cells"), 2017.*
Nielson et al. (Non-Fullerene Electron Acceptors for Use in Organic Solar cells), 2015.*
Deping Qian "Molecular Design toward Efficient Polymer Solar Cells with High Polymer Content" J. Am. Chem. Soc. 2013, 135, 8464-8467 (Year: 2013).*
Wenxing Gu "Ternary blend polymer solar cells with two non-fullerene acceptors as acceptor alloy" Dyes and Pigments 141 (2017) 388-393 (Year: 2017).*
Huawei Hu "Influence of Donor Polymer on the Molecular Ordering of Small Molecular Acceptors in Nonfullerene Polymer Solar Cells" Adv. Energy Mater. 2018, 8, 1701674 (Year: 2017).*

* cited by examiner

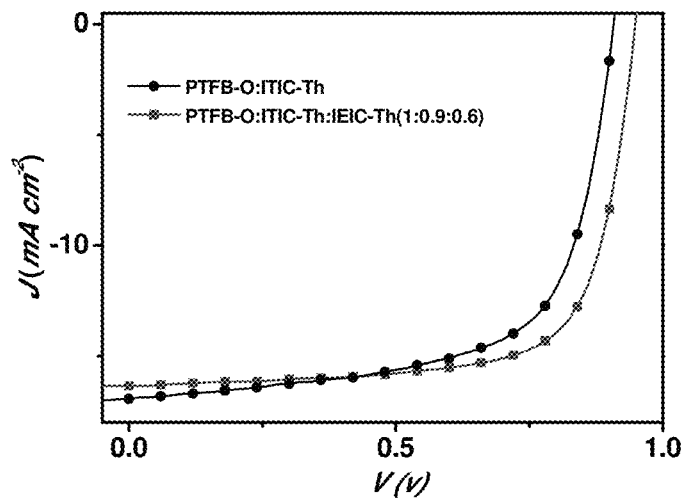
FIG. 7
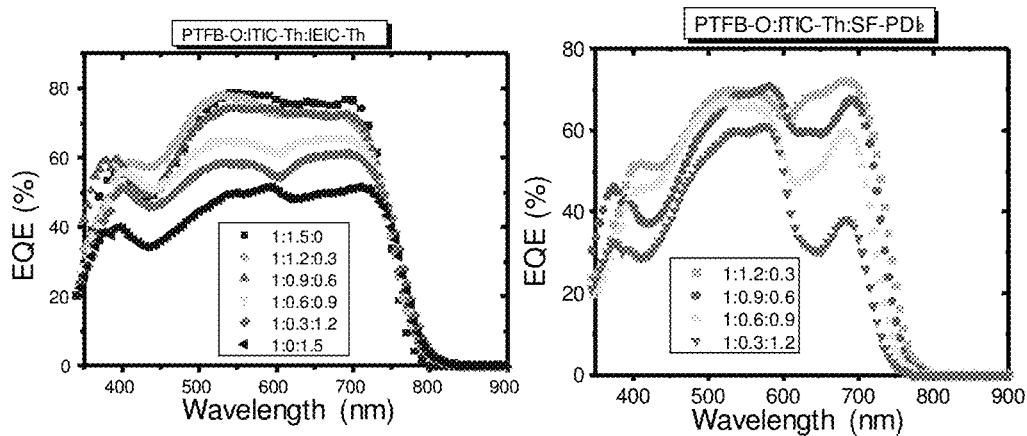
FIG. 8A-B
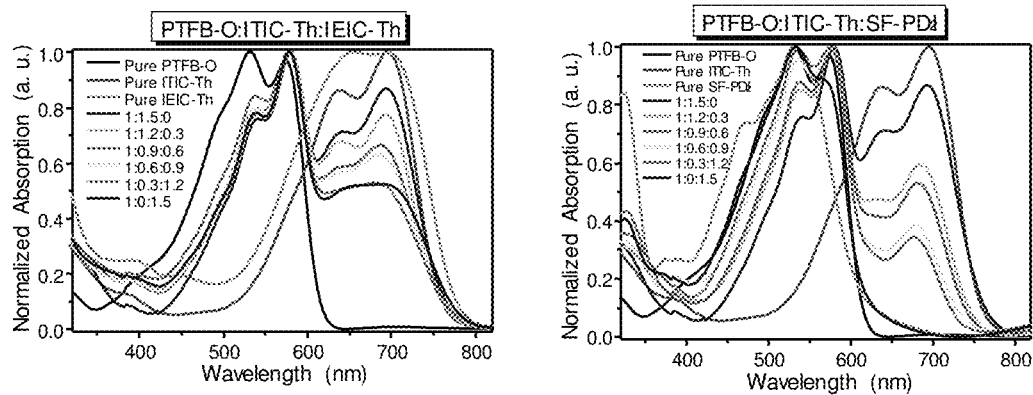
FIG. 9A-B

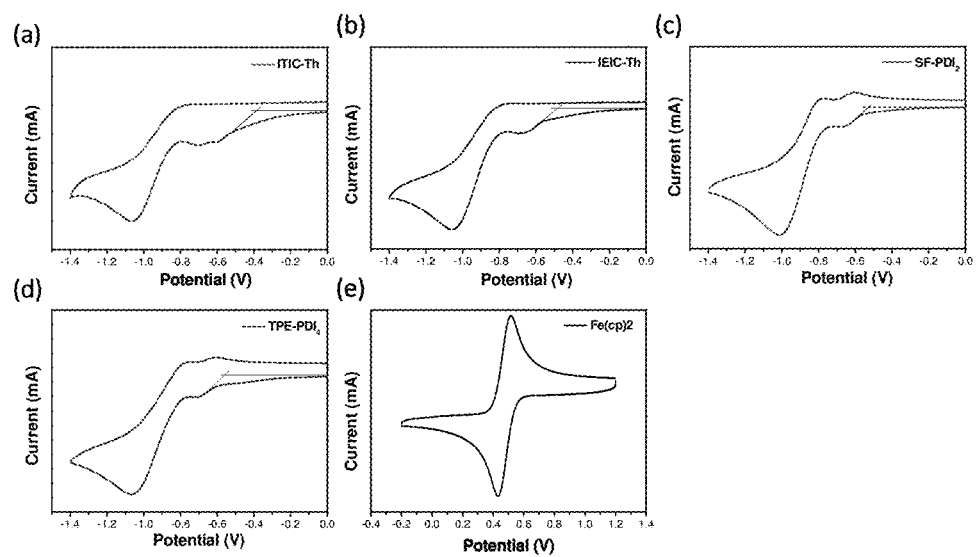
FIG. 12A-E

TERNARY BLEND ORGANIC SOLAR CELLS BASED ON ONE DONOR POLYMER AND TWO ACCEPTORS

CROSS REFERENCE

The present application claims priority to provisional U.S. Patent Application No. 62/496,211, filed Oct. 11, 2016, which was filed by the inventors hereof and is incorporated herein in its entirety.

TECHNICAL FIELD

The present subject matter relates generally to donor-acceptor conjugated polymers and methods for their preparation and corresponding intermediates used therein. The present subject matter also relates to the use of formulations containing such polymers as semiconductors in organic electronic (OE) devices, especially in organic solar cell (OSC) devices, and to the OE and OSC devices made from such formulations.

BACKGROUND

In recent years, there has been growing interest in the use of organic semiconductors, including conjugated polymers, for various electronic applications. One particular area of importance is the field of OSC. Organic semiconductors have found use in OSC because they allow devices to be manufactured by solution-processing techniques such as spin casting and printing. Compared to the evaporative techniques typically used to make inorganic thin film devices, it is cheaper to use solution processing, which can be carried out on a larger scale.

Dramatic progress has been made in the OSC field in recent years, leading to a power conversion efficiency (PCE) surpassing 10% in both single junction and tandem devices. Conventional OSC contains one donor and one acceptor material as the light absorbing active layer, but a key limitation of OSC devices is that the absorption of the active layer materials tends to be relatively narrow. As such, one option to increase the absorption width of OSC is to use a tandem structure containing two materials with complementary absorptions to cover a broad spectra range. Although the use of such a tandem structure can increase the absorption breadth of a solar cell device, the difficulty of device fabrication, and therefore the cost, for large-scale production are significantly raised.

To maintain the simplicity of the single junction structure while broadening the coverage of the solar spectrum, ternary blend bulk heterojunction (BHJ) OSCs have been developed. In the ternary blend bulk heterojunction OSCs, a combination of donors and acceptors are blended together during device fabrication, wherein the combination may be two donors and one acceptor, or the combination may be one donor and two acceptors. This is also known as the so-called ternary organic solar cell. In contrast to a conventional OSC that only contains one donor and one acceptor material, a ternary OSC covers a broader absorption range because the ternary OSC can contain three donor or acceptor materials.

In addition to increasing the photocurrent through wider absorption, ternary OSCs have gone beyond expectations since the first demonstration of devices whose open circuit voltages ($V_{oc}$) change continuously with composition. For instance, there has been a significant increase in fill factors (FF) and even a simultaneous increase in photocurrent, $V_{oc}$ and FF, demonstrated in certain ternary systems. These advances give rise to ternary OSCs having power conversion efficiencies over 10%.

The most dominant types of ternary organic solar cells are based on two donor polymers and one acceptor. However, this type of ternary OSC exhibits lower performances than corresponding binary devices. This is partially due to the complicated morphology formed by two donor polymers and one acceptor. Another type of ternary organic solar cells is based on a polymer and small molecular donor and one acceptor. This type also poses some challenges for morphology control.

For these existing ternary OSC systems, the proposed working mechanisms for ternary OSCs include charge transfer, energy transfer, and the parallel-like BHJ model. However, compared to the rapid development in PCE, the understanding of the device's operating mechanism is lacking. The main reason that causes difficulty in investigation into device physics is the complicated morphology formed by the three components, two of which are donors, in a ternary blend film, e.g. each component could form its own crystalline phase with different orientations; different components could form different mixed phases; and the domain size and purity may change dramatically with respect to composition.

Due to these reasons, the morphology of a ternary blend OSC is extremely difficult to control, as there are three components in the blend, which sets a limit to the development of ternary OSCs. Even for a binary OSC, the morphology is difficult to control. As such, the best reported efficiency of ternary OSCs is about 10.3%, which is still lower than the best binary organic solar cells (>11%). Therefore, a need exists for a ternary blend OSC with a higher PCE.

SUMMARY

In an embodiment, the present subject matter is directed to an organic solar cell comprising a photoactive layer that comprises at least one donor polymer and two non-fullerene molecular acceptors.

In an embodiment, the present subject matter is directed to an organic solar cell comprising a photoactive layer that comprises one donor polymer, one fullerene acceptor, and one non-fullerene molecular acceptor.

In an embodiment, the donor polymer may exhibit temperature dependent aggregation (TDA) properties in solution, wherein the absorption onset of the polymer solution exhibits a red shift of at least 80 nm when the solution is cooled from 100° C. to room temperature or the absorption onset of the polymer solution exhibits a red shift of at least 40 nm when the solution is cooled from 100° C. to 0° C.

BRIEF DESCRIPTION OF THE DRAWINGS

FIG. 7 shows current density-voltage plots measured under AM 1.5G illumination for PTFB-O:ITIC-Th binary and PTFB-O:ITIC-Th:IEIC-Th (1:0.9:0.6) ternary devices.

FIGS. 8A-B show UV-Vis absorption spectra of PTFB-O:ITIC-Th:IEIC-Th (or SF-PDI$_2$) binary or ternary films plotted together with each pure material's thin film absorption.

FIGS. 9A-B show EQE spectra of the PTFB-O:ITIC-Th:IEIC-Th (or SF-PDI$_2$) binary or ternary devices.

FIGS. 12A-E shows the energy level of all materials in 0.1 M (n-Bu)4N+PF6– acetonitrile solution according to the present teaching measurement. In particular, it shows electrochemical cyclic voltammograms of ITIC-Th (a), IEIC-Th (b), SF-PDI$_2$ (c), TPE-PDI$_4$ (d) and ferrocene (e), wherein arrows indicate the potential onset of the oxidation or reduction reactions in the electrochemical measurements.

DETAILED DESCRIPTION

Definitions

Figure 1:
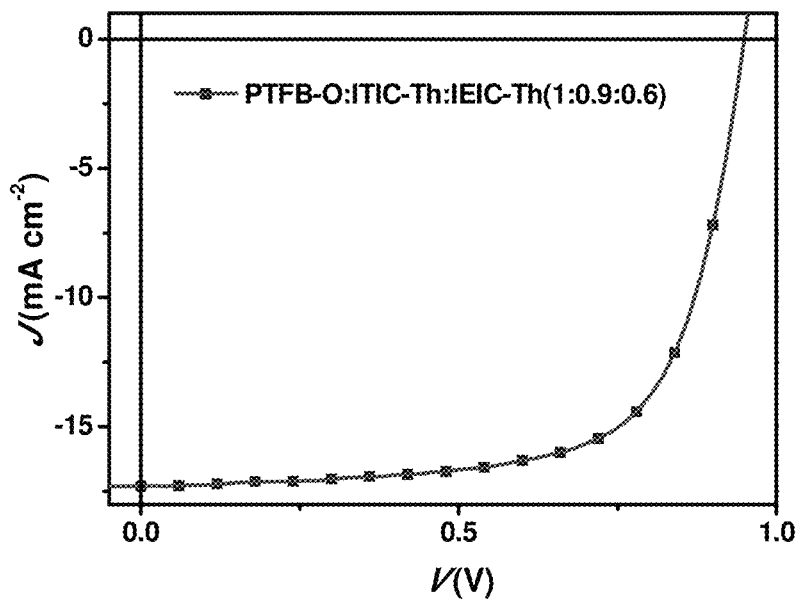
FIG. 1 shows the J-V curves of best efficiency of ternary solar cell.

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include", "includes", "including", "have", "has", or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material having holes as the majority current or charge carriers, for example, an organic semiconductor material. In some embodiments, when a p-type semiconductor material is deposited on a substrate, it can provide hole mobility in excess of about $10^{-5}$ cm/Vs. In the case of field-effect devices, a p-type semiconductor also can exhibit a current on/off ratio of greater than about 10.

As used herein, an "n-type semiconductor material" or an "acceptor" material refers to a semiconductor material having electrons as the majority current or charge carriers, for example, an organic semiconductor material. In some embodiments, when an n-type semiconductor material is deposited on a substrate, it can provide electron mobility in excess of about $10^{-5}$ cm/Vs. In the case of field-effect devices, an n-type semiconductor also can exhibit a current on/off ratio of greater than about 10.

As used herein, "absorption onset" refers to the onset point of the UV-Vis absorption spectra for the polymer solution where the polymer starts to absorb light.

As used herein, "temperature dependent aggregation (TDA) properties" refers to the UV-Vis absorption spectra of the polymer solution red-shifts for more than 80 nm when the solution is cooled from 100° C. to room temperature, or, in some cases, the UV-Vis absorption spectra of the polymer solution red-shifts for more than 40 nm when the solution is cooled from 100° C. to 0° C.

As used herein, a correlation can be considered "quasi-linear response" when two acceptors form an organic alloy, characterized in that the Voc of the organic solar cell with the ratio of the two acceptors.

As used herein, "mobility" refers to a measure of the velocity with which charge carriers move through a material under the influence of an electric field, for example, holes (or units of positive charge) in the case of a p-type semiconductor material and electrons (or units of negative charge) in the case of an n-type semiconductor material. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity, and temperature, over a 3 day, 5 day, or 10 day period.

As used herein, fill factor (FF) is the ratio (given as a percentage) of the actual maximum obtainable power, (Pm or Vmp*Jmp), to the theoretical (not actually obtainable) power, (Jsc*Voc). Accordingly, FF can be determined using the equation:

$$FF=(Vmp*Jmp)/(Jsc*Voc)$$

where Jmp and Vmp represent the current density and voltage at the maximum power point (Pm), respectively, this point being obtained by varying the resistance in the circuit until J*V is at its greatest value; and Jsc and Voc represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (Voc) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (Pm) by the input light irradiance (E, in W/m2) under standard test conditions (STC) and the surface area of the solar cell (Ac in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the DSC or XRD measurements of the as-deposited and the annealed films.

As used herein, a "polymeric compound" (or "polymer") refers to a molecule including a plurality of one or more repeating units connected by covalent chemical bonds. A polymeric compound can be represented by General Formula I:

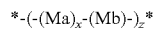                                    General Formula I wherein each Ma and Mb is a repeating unit or monomer. The polymeric compound can have only one type of repeating unit as well as two or more types of different repeating units.

When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which comonomers Ma and Mb is repeated can be alternating, random, regiorandom, regioregular, or in blocks, with up to z comonomers present. In addition to its composition, a polymeric compound can be further characterized by its degree of polymerization (n) and molar mass (e.g., number average molecular weight (M) and/or weight average molecular weight (Mw) depending on the measuring technique(s)).

As used herein, "halo" or "halogen" refers to fluoro, chloro, bromo, and iodo.

Furthermore, it should be understood that the drawings described herein are for illustration purposes only. The drawings are not necessarily to scale, with emphasis generally being placed upon illustrating the principles of the present teachings. The drawings are not intended to limit the scope of the present teachings in any way.

Ternary Blend OSC

To address the problems in the prior art, such as the morphology control problem and increasing the efficiency of ternary organic solar cells, the present subject matter is directed to organic formations and polymers for ternary OSC that can maintain good morphology and achieve higher performance.

Unlike the previous state of art, in which two donors and one acceptor are used, it was surprisingly found in the present subject matter that ternary OSCs based on one donor polymer, or conjugated polymer, and two molecular acceptors can offer much better morphology control and performance. In such a ternary blend, the morphology is mainly dominated by the donor polymer, while the two acceptors play a minor role. As used herein, "donor polymers" and "conjugated polymers" are interchangeable and refer to the same polymers.

In an embodiment of the present subject matter, a donor polymer with a strong temperature dependent aggregation property is utilized as one of the components of the ternary blend OSC, characterized in that the UV-Vis absorption spectra of the polymer, when in solution, red-shifts for more than 80 nm when the solution is cooled from 100° C. to room temperature. Such a dramatic red-shift property upon cooling is attributed to the strong temperature dependent aggregation (TDA) of the polymer. For simplicity in describing the present subject matter, the TDA property is defined as the UV-Vis absorption spectra of the polymer solution red-shifts for more than 80 nm when the solution is cooled from 100° C. to room temperature, or, in some cases, the UV-Vis absorption spectra of the polymer solution red-shifts for more than 40 nm when the solution is cooled from 100° C. to 0° C.

Surprisingly, it was found that an excellent performance can be achieved by using a polymer with strong TDA properties and mixing it with two acceptors. This performance is attributed to the ability of the donor polymer to control morphology via its temperature dependent aggregation.

In an embodiment of the present subject matter, by combining such a donor polymer with two small molecular acceptors (SMAs), polymer/small molecule blends were obtained that can achieve high efficiency (>11%), which is the best known efficiency for ternary OSC to-date. The SMAs are selected from the same surface energy, but are not limited to small molecular alloys. Further, the SMAs have close surface tension and thus tend to form an intermixed organic phase. Such a ternary blend exhibits a simplified and favorable BHJ morphology that is similar to the near-two-phase morphology of previously reported binary blends.

A surprising effect was observed in that crystallinity of the acceptor phase at an optimal ratio of the two SMAs was improved. This enables more elaborate control over the nanoscale morphology, which allows for improved FF and efficiency of devices. Further, the strong TDA property of the donor polymer enables effective morphology control, demonstrating over a dozen ternary blends with similar morphology. The best efficiency achieved for the ternary blend OSC of the present subject matter was 11.3%, which is the highest performance for ternary blend organic solar cells to-date.

Figure 4A:
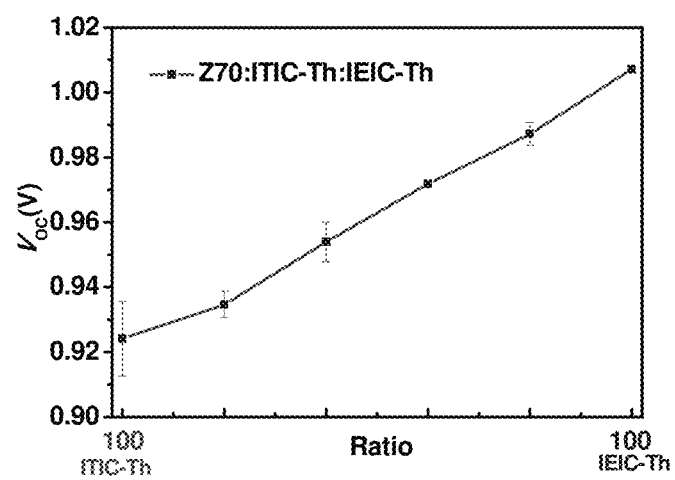
FIGS. 4A-B show the linear change of ternary solar cell.
Figure 4B:
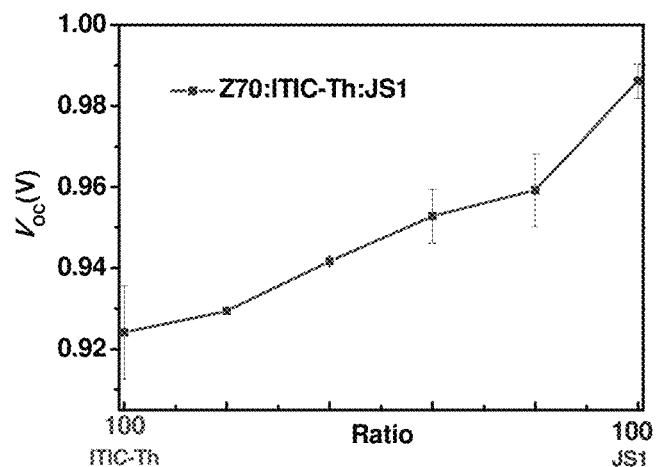

In an embodiment of the present subject matter, it was demonstrated that a non-fullerene ternary OSC (PTFB-O: ITIC-Th:IEIC-Th) reaches a peak PCE of 11.3% ($V_{oc}$=0.949 V, $J_{sc}$=17.22 mA/cm$^2$, FF=0.687) at a composition of 1:0.9: 0.6. This is the highest PCE obtained for all ternary organic solar cells to-date. More importantly, the $V_{oc}$ of the ternary devices exhibit a linear increase with increasing content of IEIC-Th, which suggests the formation of an organic alloy between the two SMAs, which is confirmed by the EL-EQE experiment, which is in turn explained by the small interfacial tension between the two SMAs revealed by surface energy analysis (FIGS. 4A-B). Based on the result of the dynamic-SIMS experiment and device recombination analysis, the increase in FF of the best ternary devices is attributed to the improved interfacial coupling between the polymer and acceptor alloy, reduced trap-assisted recombination, and more favorable vertical phase segregation in the active layer. Next, another three component combination (SF-PDI$_2$, TPE-PDI$_4$, diPDI) with a completely different chemical structure, but almost identical surface energy as IEIC-Th, was chosen.

In an embodiment, formulations were demonstrated which comprise one or more organic solvents, two small molecular materials, and one conjugated polymer with TDA property, which enabled the formation of an alloy for the two small molecular materials.

To further test the hypothesis that the host matrix formed by PTFB-O and ITIC-Th is insensitive to the choice of the third component, PC$_{71}$BM (the classical fullerene acceptor with a much higher surface energy than either of the binary components) was mixed into the blend. Surprisingly, improved device performance was still obtained with improved fill factors at certain compositions. Importantly, there was no alloy formation between the ITIC-Th and PC$_{71}$BM, due to their large interfacial tension, and the resultant $V_{oc}$ are pinned to ITIC-Th in a wide range of compositions.

It was surprisingly found that, when polymers were combined with two SMAs with the same surface energy, the best efficiency can be achieved. It was also surprisingly found that this combination results in an acceptor organic alloy, and the $V_{oc}$ change is linear. The most surprising results are that the formation of the organic alloy does not necessarily require similar chemical structures, but rather depends on the minimized interfacial tension between the molecules. Importantly, as expected, if there is no alloy formation, improved device performance with improved fill factors at certain compositions may still be obtained.

In an embodiment, the present subject matter is directed to an organic solar cell comprising a photoactive layer that comprises at least one donor polymer and two non-fullerene molecular acceptors.

In an embodiment, the donor polymer exhibits temperature dependent aggregation (TDA) properties in solution, wherein the absorption onset of the polymer solution exhibits a red shift of at least 80 nm when the solution is cooled from 100° C. to room temperature; or the absorption onset of the polymer solution exhibits a red shift of at least 40 nm when the solution is cooled from 100° C. to 0° C.

In an embodiment, the donor polymer comprises one or more units of the following formula:

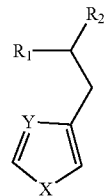

wherein
each X is S or Se;
each Y is N or C—H; and
each R$_1$ and R$_2$ is independently selected from the group consisting of straight-chain, branched, and cyclic alkyl groups with 2-40 C atoms, wherein one or more non-adjacent C atoms are optically replaced by —O—, —S—, —C(O)—, —C(O)—O—, —O—C(O)—, —O—C(O)—O—, —CR$^0$=CR$^{00}$—, or —C≡C—, and wherein one or more H atoms are optionally replaced by F, Cl, Br, I, or CN or denote aryl, heteroaryl, aryoxy, heteroaryloxy, arycarbonyl, heteroarycarbonyl, arycarbonyloxy, heteroarylcarbonyloxy, aryxycarbonyl, or heteroaryloxycarbonyl having 4 to 30 ring atoms unsubstituted or substituted by one or more non-aromatic groups, wherein R$^0$ and R$^{00}$ are independently a straight-chain, branched, or cyclic alkyl group.

In an embodiment, the donor polymer comprises one or more units of the following formula:

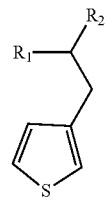

wherein each R$_1$ and R$_2$ is independently selected from the group consisting of straight-chain alkyl groups with 2-15 C atoms.

In an embodiment, the donor polymer comprises one or more units of the following formula:

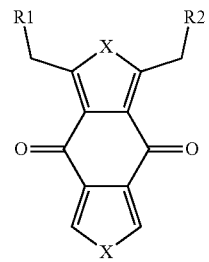

wherein
each X is S, O, or Se;
each R$_1$ and R$_2$ is independently selected from the group consisting of straight-chain, branched, and cyclic alkyl groups with 2-40 C atoms.

In an embodiment, the donor polymer comprises one or more repeating units of the formulae:

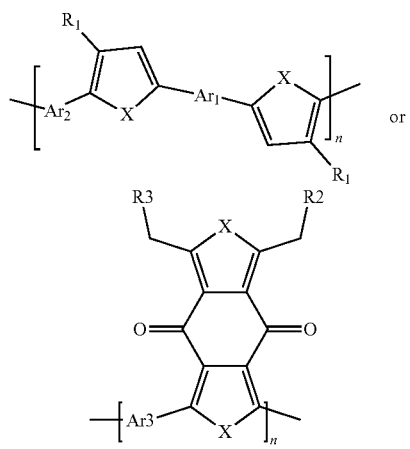

wherein each X is O, S, or Se;

n is an integer that is 1 or greater;

each $Ar_1$, $Ar_2$, and $Ar_3$ is independently selected from the group consisting of unsubstituted or substituted monocyclic, bicyclic, and polycyclic arylene, and monocyclic, bicyclic, and polycyclic heteroarylene; wherein $Ar_1$, $Ar_2$, and $Ar_3$ may contain one to five of said arylene or heteroarylene each of which may be fused or linked; and each $R_1$, $R_2$, and $R_3$ is independently selected from the group consisting of straight-chain, branched, and cyclic alkyl groups with 2-40 C atoms.

In an embodiment, the donor polymer comprises one or more repeating units of the formulae:

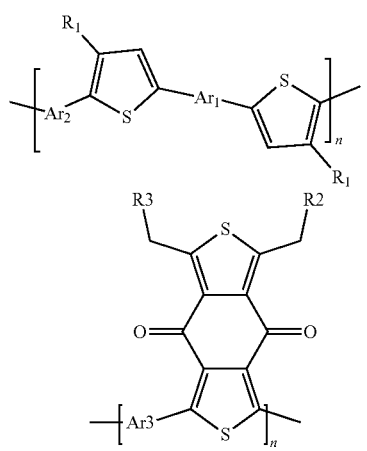

wherein n is an integer that is 1 or greater;

each $R_1$, $R_2$, and $R_3$ is independently selected from the group consisting of straight-chain, branched, and cyclic alkyl groups with 2-40 C atoms; and each $Ar_1$, $Ar_2$, and $Ar_3$ is independently selected from the group consisting of:

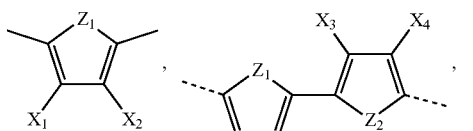

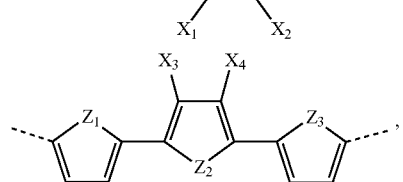

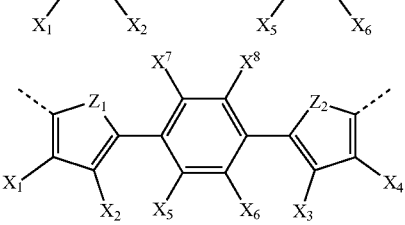

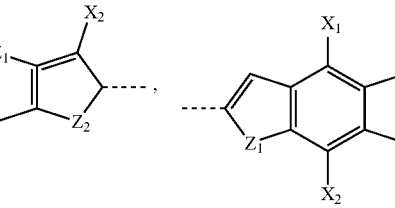

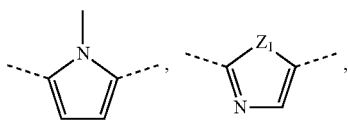

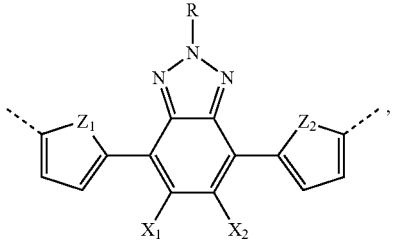

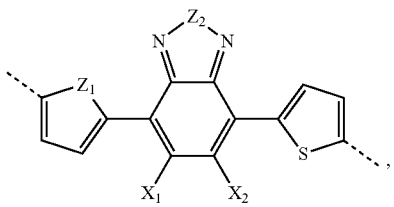

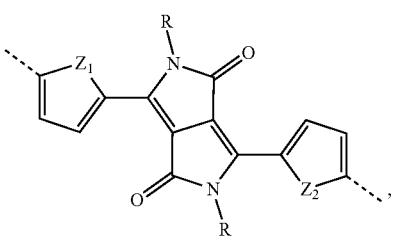

US 12,415,885 B2
11
-continued
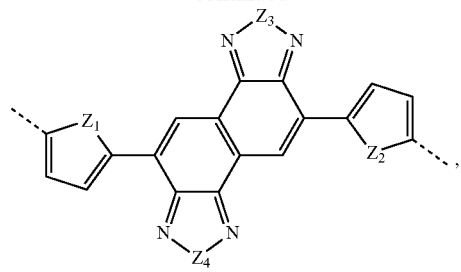
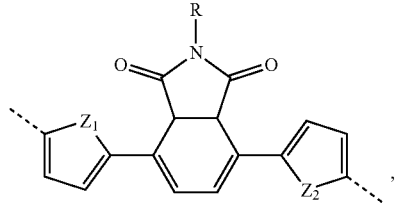
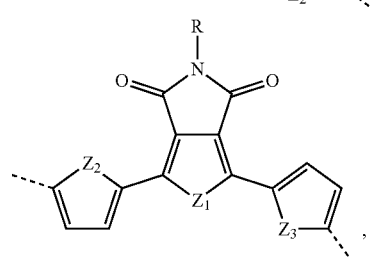
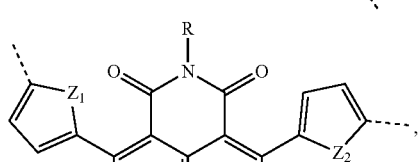
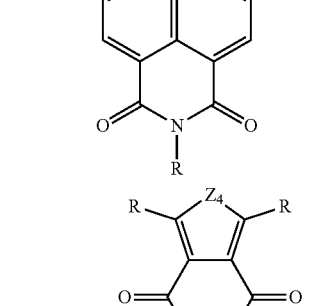
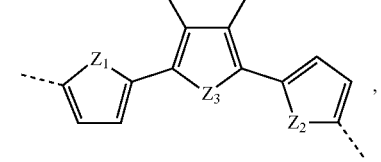
12
-continued
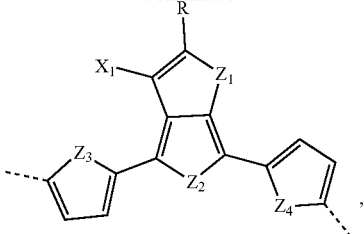
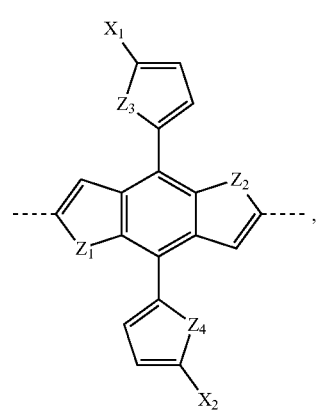
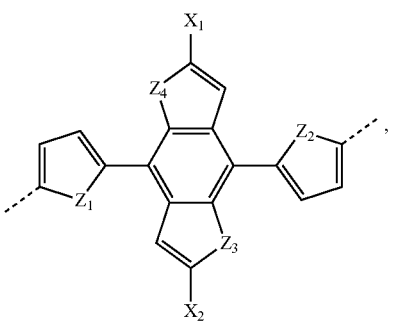
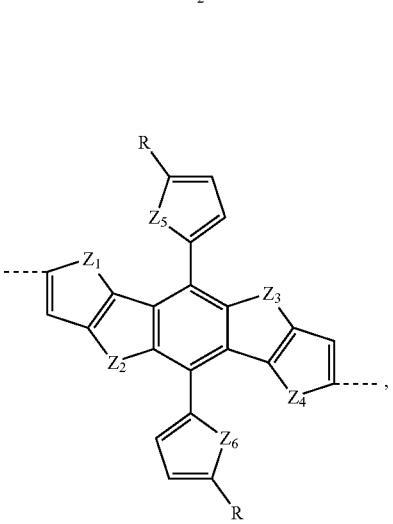

13
-continued
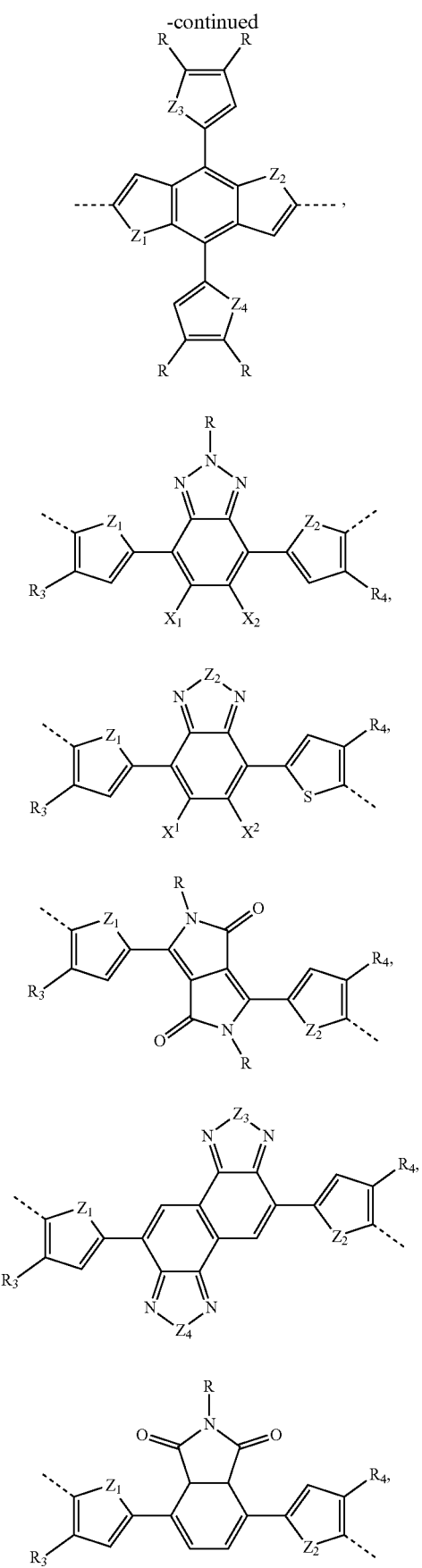
14
-continued
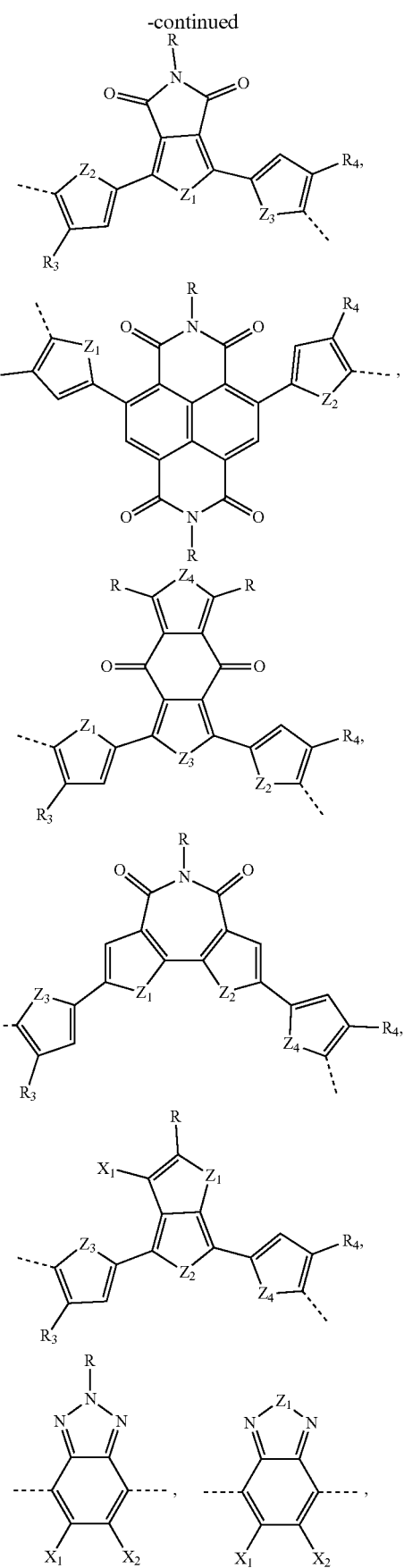

-continued
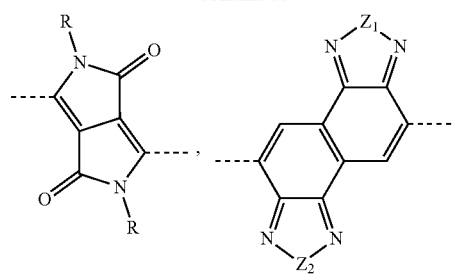
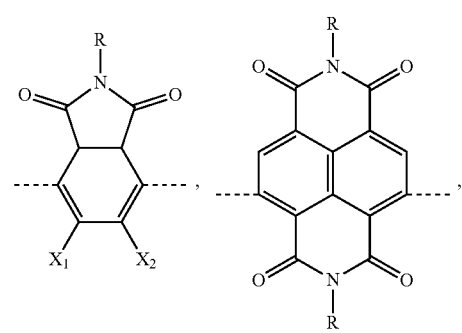
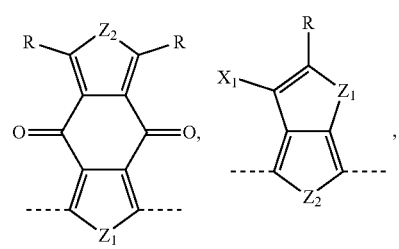
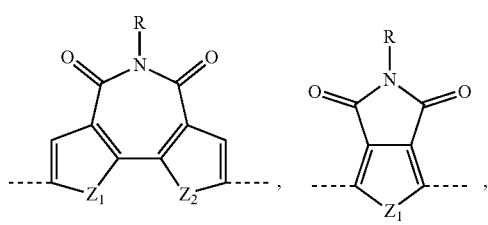
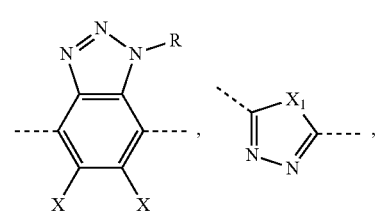
-continued
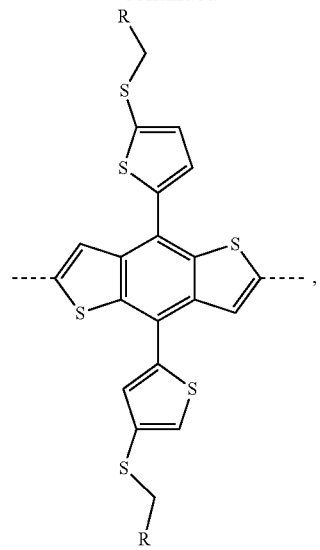
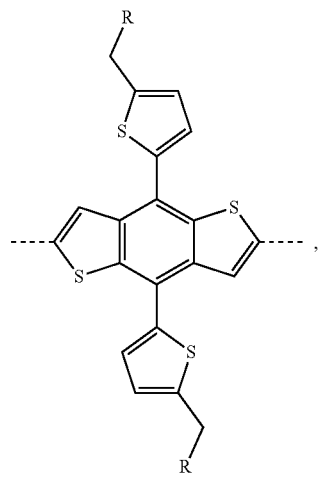
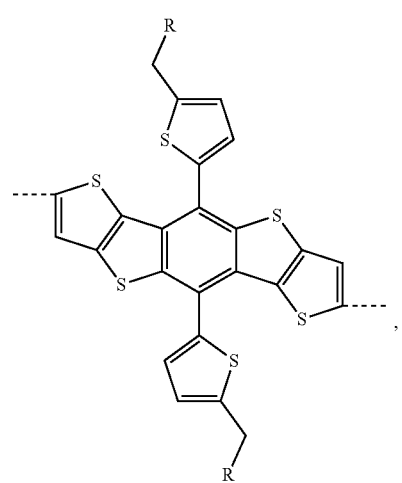

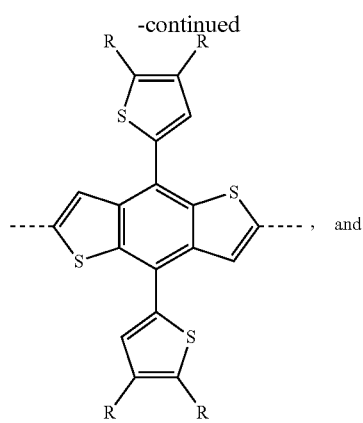

and

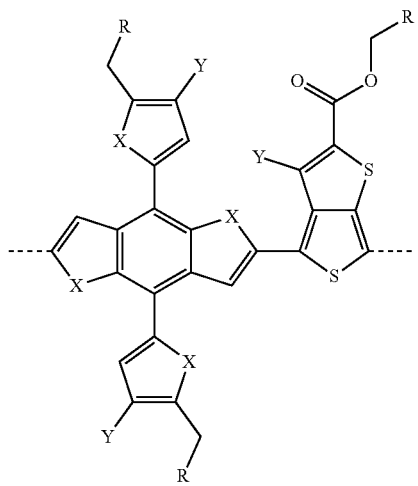

wherein
each R is independently selected from the group consisting of straight-chain, branched, and cyclic alkyl groups with 2-40 C atoms;
each X is O, S or Se; and
each Y is H, F, or Cl.

In an embodiment, the donor polymer comprises one or more repeating units of the following formula:

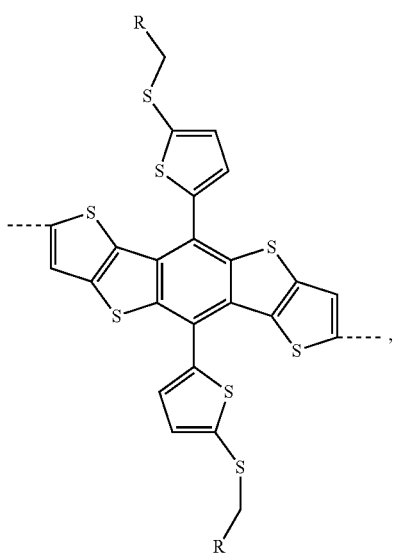

wherein
each $Z_1$, $Z_2$, $Z_3$, $Z_4$, $Z_5$, and $Z_6$ is S, O, or Se;
each X, $X_1$, $X_2$, $X_3$, $X_4$, $X_5$, $X_6$, $X_7$, and $X_8$ is H, F, or Cl; and
each R, $R_3$, and $R_4$ is independently selected from the group consisting of straight-chain, branched, and cyclic alkyl with 2-40 C atoms, wherein one or more non-adjacent C atoms are optically replaced by —O—, —S—, —C(O)—, —C(O—)—O—, —O—C(O)—, —O—C(O)—O—, —CR$^o$=CR$^{oo}$—, or —C≡C—, and wherein one or more H atoms are optionally replaced by F, Cl, Br, I, or CN or denote aryl, heteroaryl, aryoxy, heteroaryloxy, arycarbonyl, heteroarycarbonyl, arycarbonyloxy, heteroarylcarbonyloxy, aryxycarbonyl, or heteroaryloxycarbonyl having 4 to 30 ring atoms unsubstituted or substituted by one or more non-aromatic groups, wherein R$^o$ and R$^{oo}$ are independently a straight-chain, branched, or cyclic alkyl group.

In an embodiment, the donor polymer comprises one or more repeating units of the following formula:

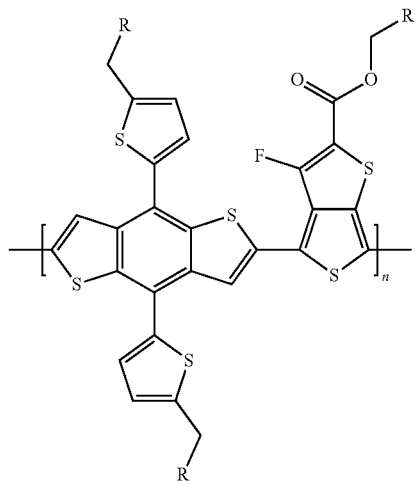

wherein
n is an integer that is 1 or greater; and
each R is independently selected from the group consisting of straight-chain, branched, and cyclic alkyl groups with 2-40 C atoms.

In an embodiment, at least one of the molecular acceptors comprises a unit having a formula selected from the group consisting of:

19 20
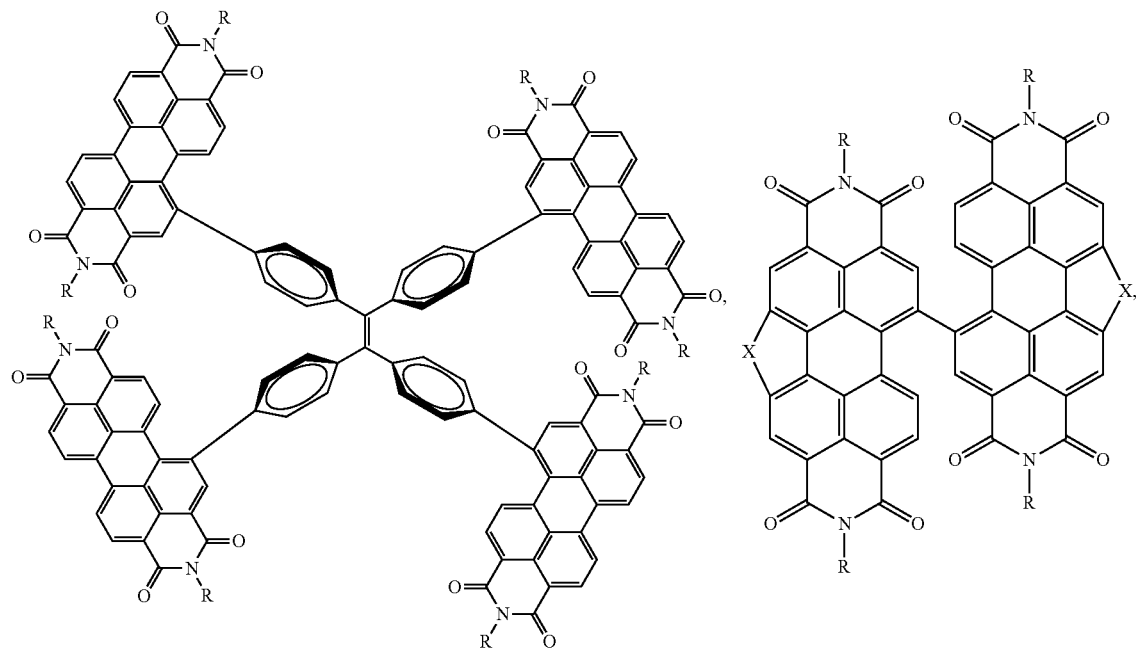
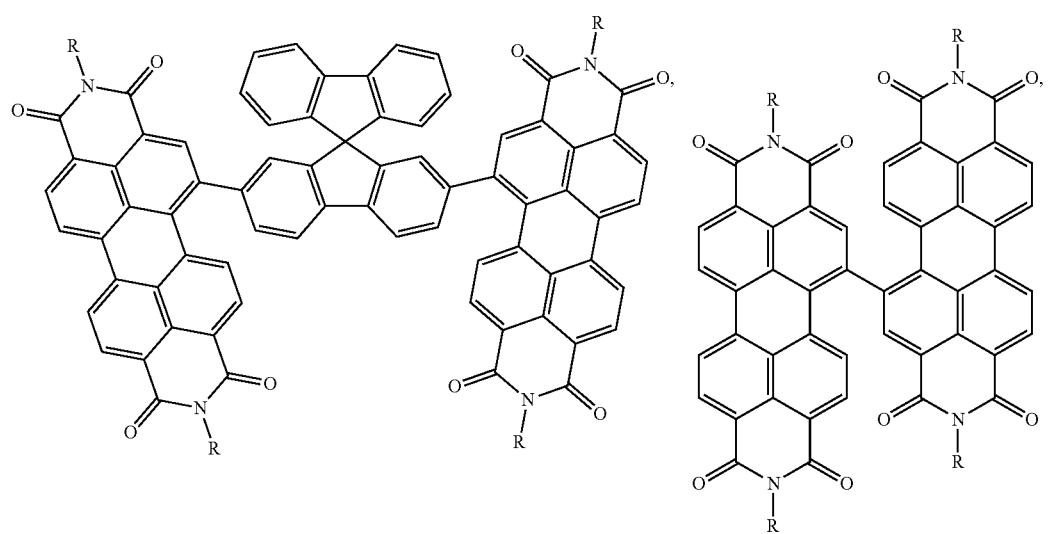

-continued
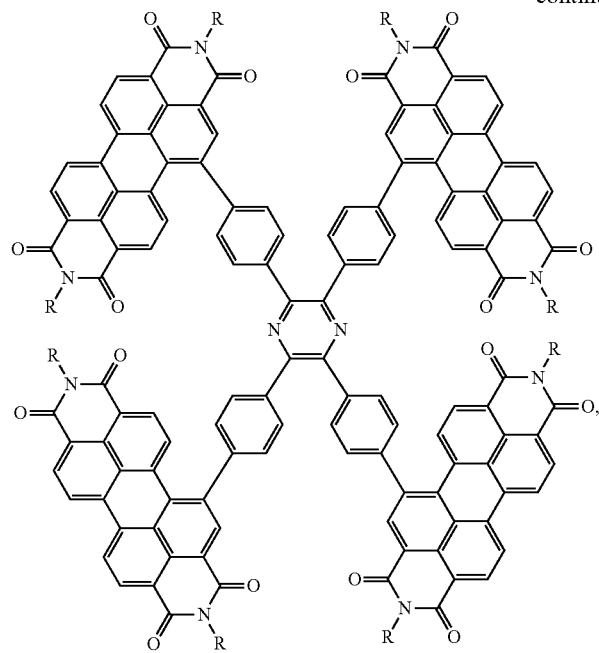
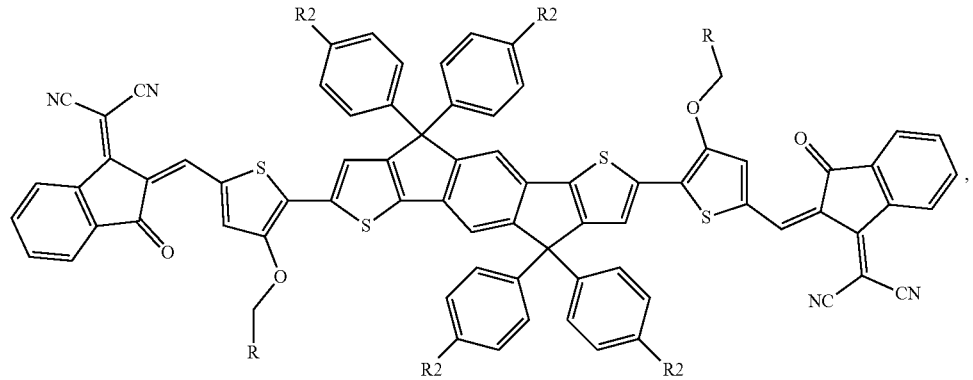
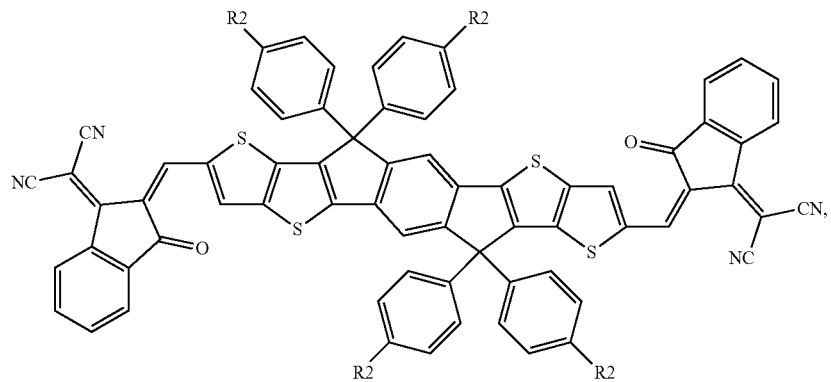

-continued
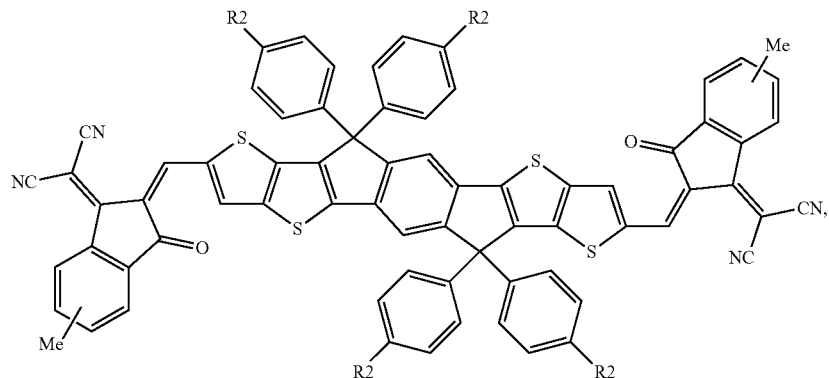
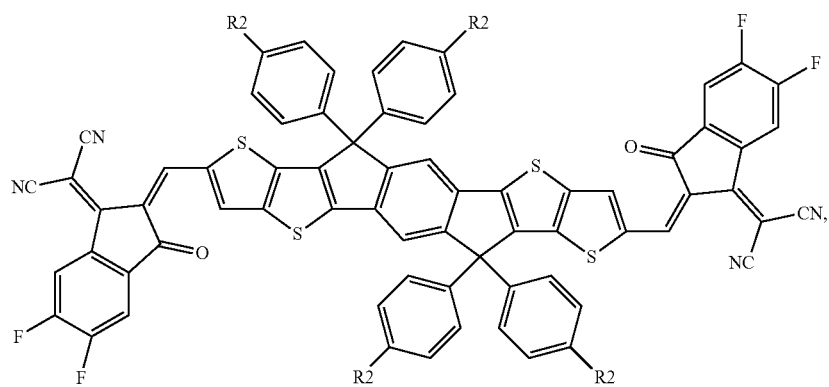
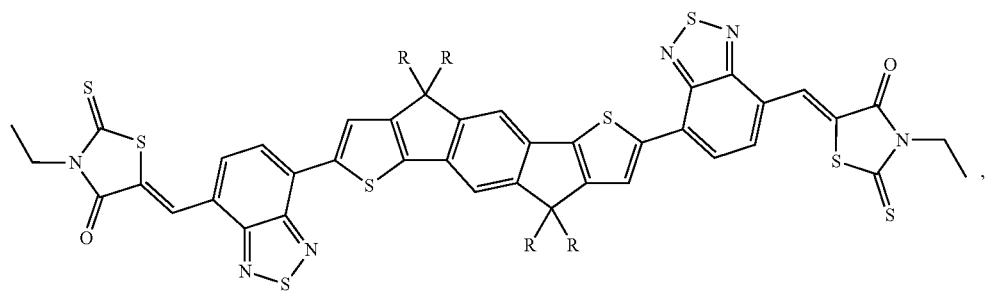
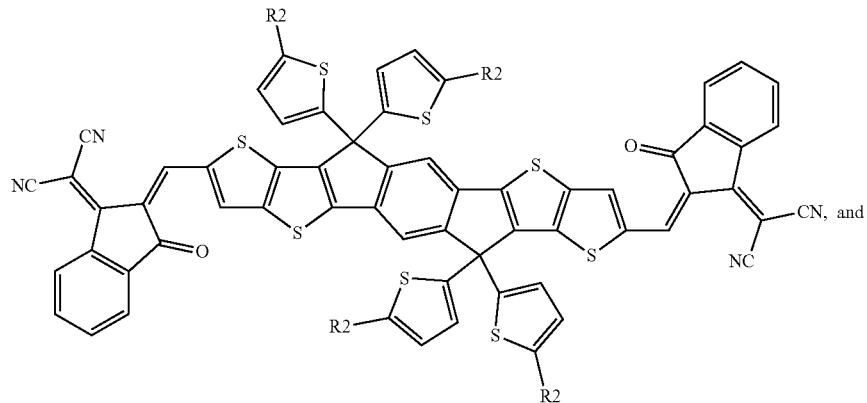

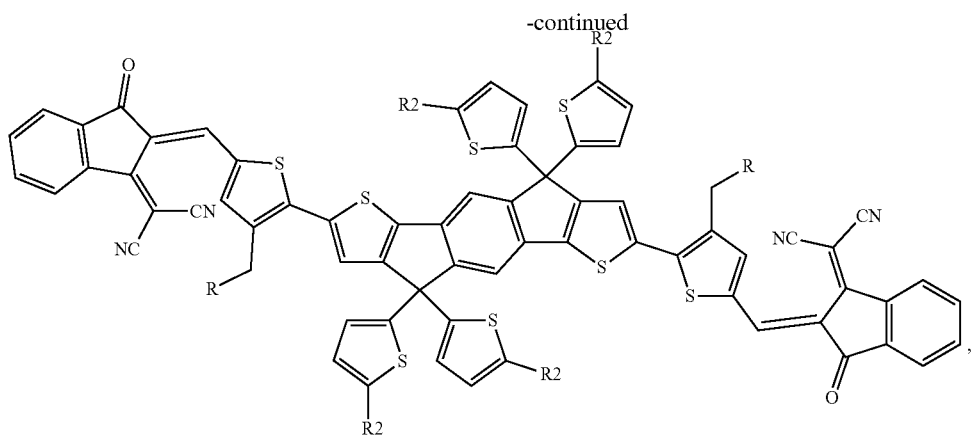

wherein each R and $R_2$ is independently selected from the group consisting of straight-chain, branched, and cyclic alkyl groups with 2-40 C atoms.

In an embodiment, a difference in surface energy between the two molecular acceptors is smaller than a difference in surface energy between the donor polymer and either of the two molecular acceptors.

In an embodiment, the present subject matter is directed to an organic solar cell comprising a photoactive layer that comprises one donor polymer, one fullerene acceptor, and one non-fullerene molecular acceptor.

In an embodiment, the donor polymer exhibits temperature dependent aggregation (TDA) properties in solution, wherein
the absorption onset of the polymer solution exhibits a red shift of at least 80 nm when the solution is cooled from 100° C. to room temperature; or
the absorption onset of the polymer solution exhibits a red shift of at least 40 nm when the solution is cooled from 100° C. to 0° C.

In an embodiment, the donor polymer comprises one or more units of the following formula:

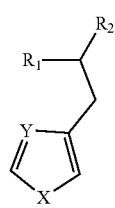

wherein
each X is S or Se;
each Y is N or C—H; and
each $R_1$ and $R_2$ is independently selected from the group consisting of straight-chain, branched, and cyclic alkyl groups with 2-40 C atoms, wherein one or more non-adjacent C atoms are optically replaced by —O—, —S—, —C(O)—, —C(O—)—O—, —O—C(O)—, —O—C(O)—O—, —CR°=CR°°—, or —C≡C—, and wherein one or more H atoms are optionally replaced by F, Cl, Br, I, or CN or denote aryl, heteroaryl, aryoxy, heteroaryloxy, arycarbonyl, heteroarycarbonyl, arycarbonyloxy, heteroarylcarbonyloxy, aryxycarbonyl, or heteroaryloxycarbonyl having 4 to 30 ring atoms unsubstituted or substituted by one or more non-aromatic groups, wherein R° and R°° are independently a straight-chain, branched, or cyclic alkyl group.

In an embodiment, the donor polymer comprises one or more units of the following formula:

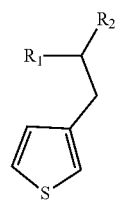

wherein each $R_1$ and $R_2$ is independently selected from the group consisting of straight-chain alkyl groups with 2-15 C atoms.

In an embodiment, the donor polymer comprises one or more units of the following formula:

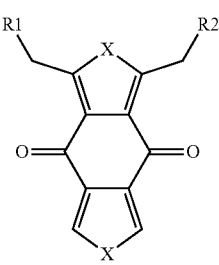

wherein
each X is S, O, or Se; and
each $R_1$ and $R_2$ is independently selected from the group consisting of straight-chain, branched, and cyclic alkyl groups with 2-40 C atoms.

In an embodiment, the donor polymer comprises one or more repeating units of the formulae:

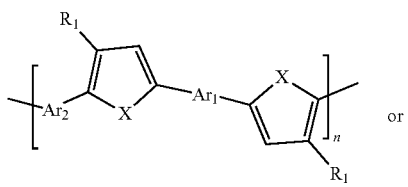

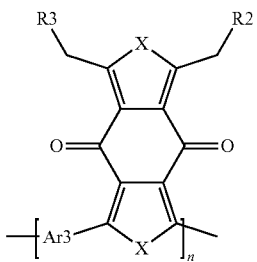

wherein n is an integer that is 1 or greater;

each X is O, S, or Se;

each Ar$_1$, Ar$_2$, and Ar$_3$ is independently selected from the group consisting of unsubstituted or substituted monocyclic, bicyclic, and polycyclic arylene, and monocyclic, bicyclic, and polycyclic heteroarylene, wherein Ar$_1$, Ar$_2$, and Ar$_3$ may contain one to five of said arylene or heteroarylene each of which may be fused or linked; and each R$_1$, R$_2$, and R$_3$ is independently selected from the group consisting of straight-chain, branched, and cyclic alkyl groups with 2-40 C atoms.

In an embodiment, the donor polymer comprises one or more repeating units of the formulae:

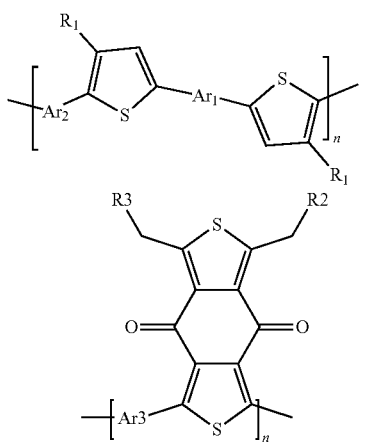

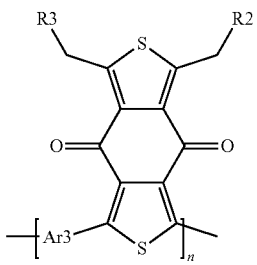

wherein n is an integer that is 1 or greater;

each R$_1$, R$_2$, and R$_3$ is independently selected from the group consisting of straight-chain, branched, and cyclic alkyl groups with 2-40 C atoms; and each Ar$_1$, Ar$_2$, and Ar$_3$ is independently selected from the group consisting of:

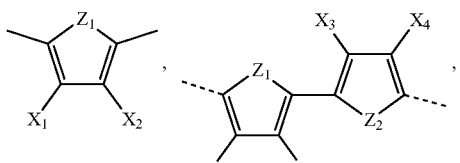

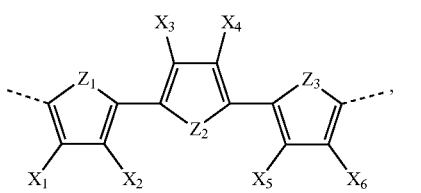

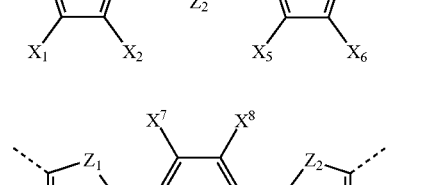

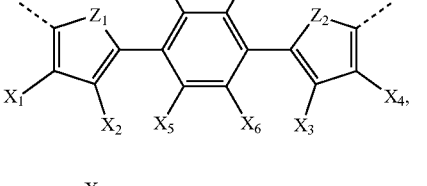

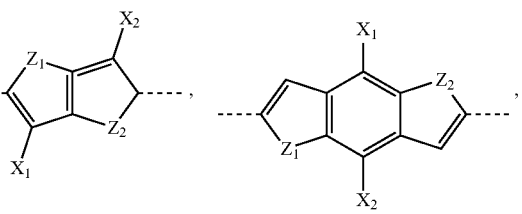

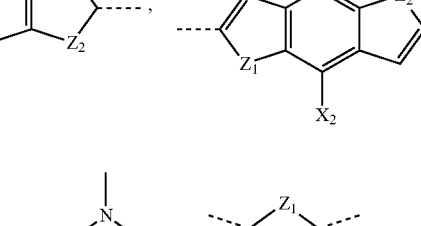

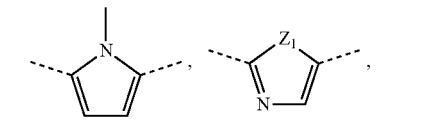

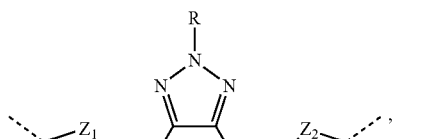

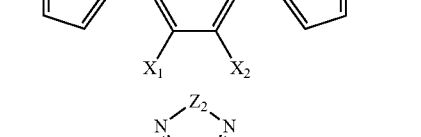

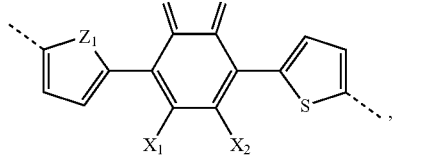

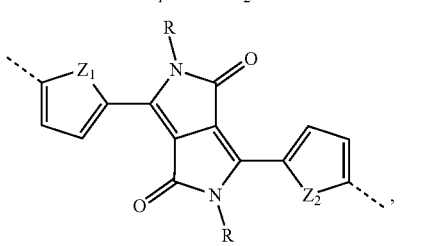

-continued
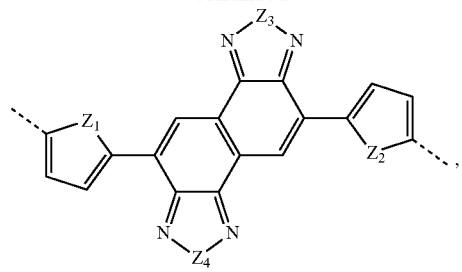
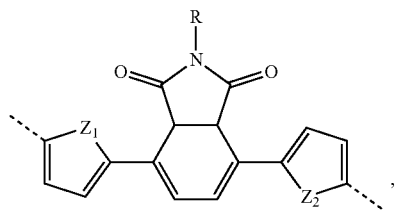
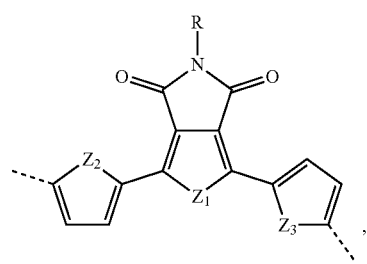
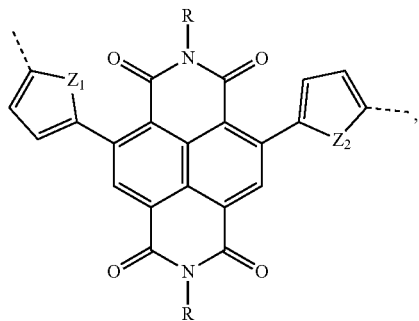
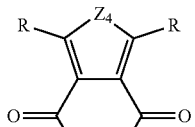
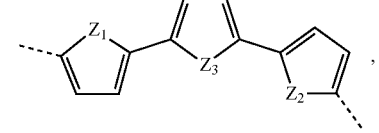
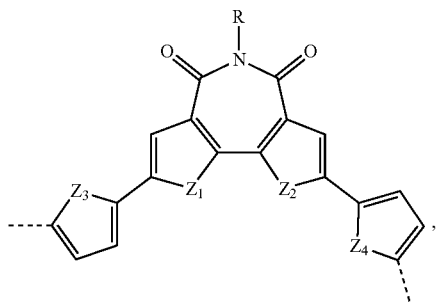
-continued
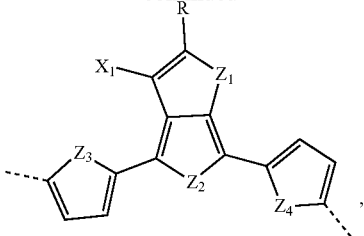
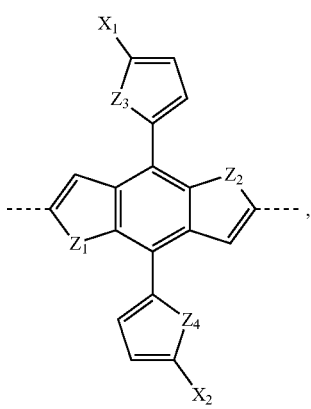
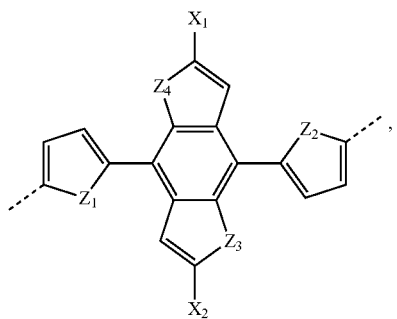
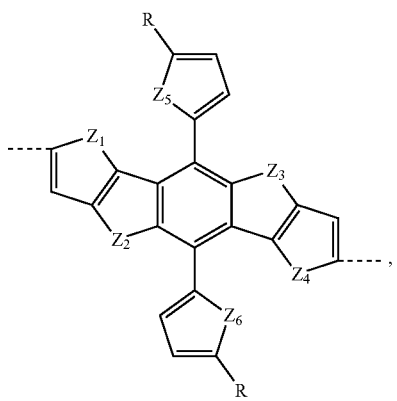

-continued
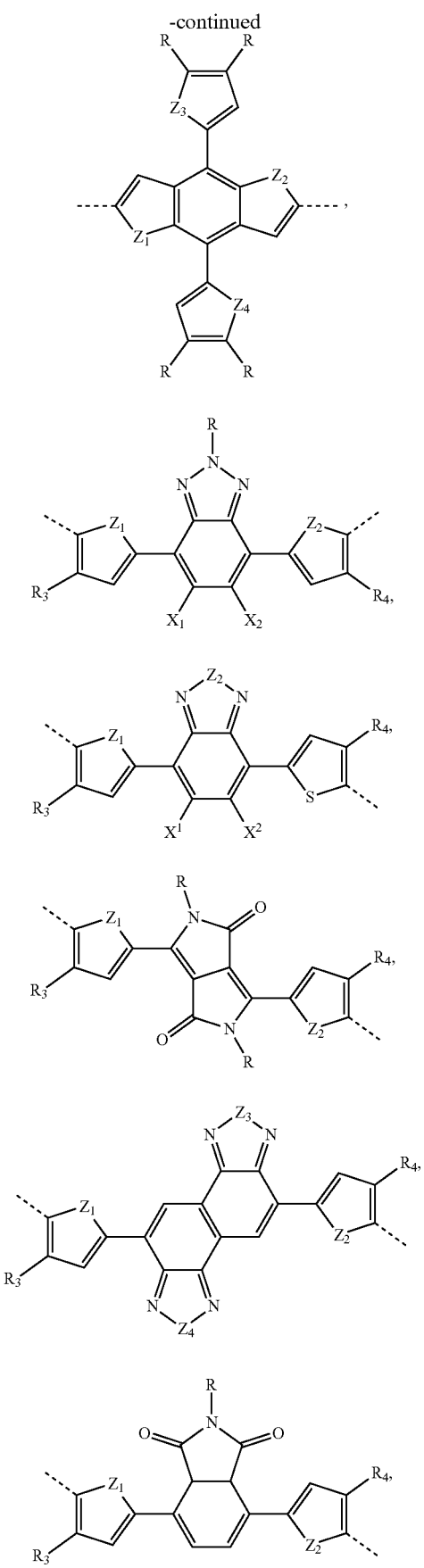
-continued
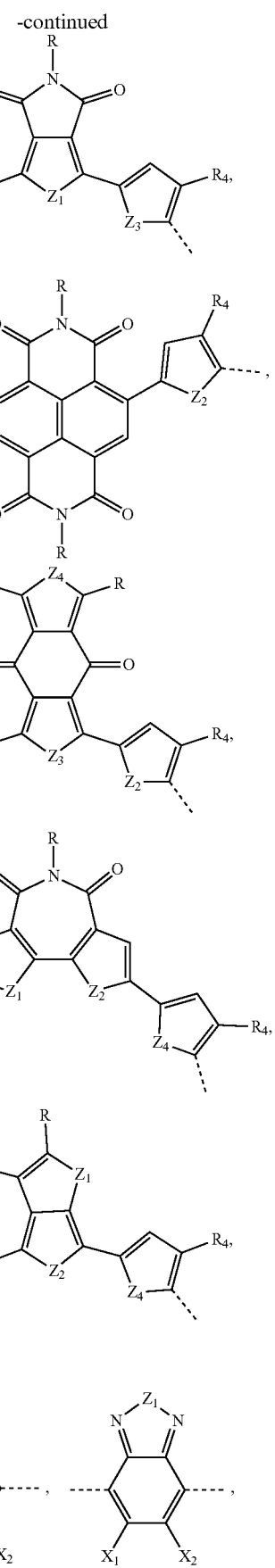

-continued
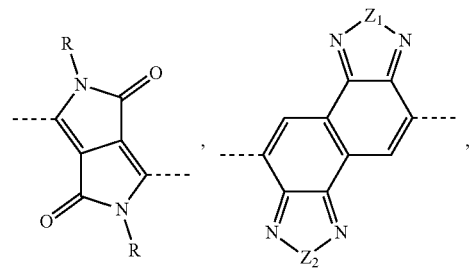
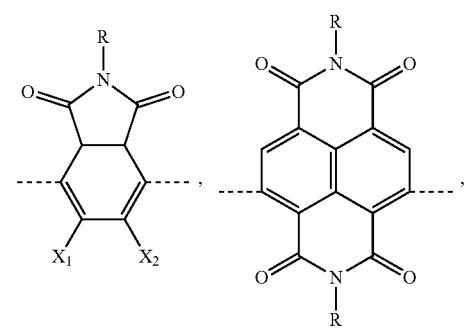
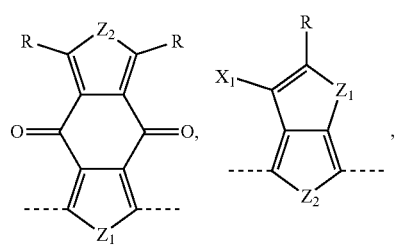
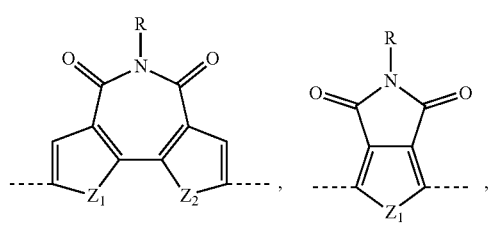
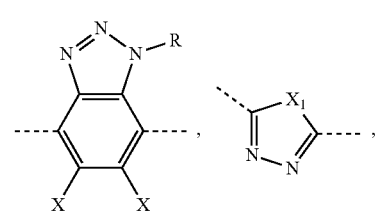
-continued
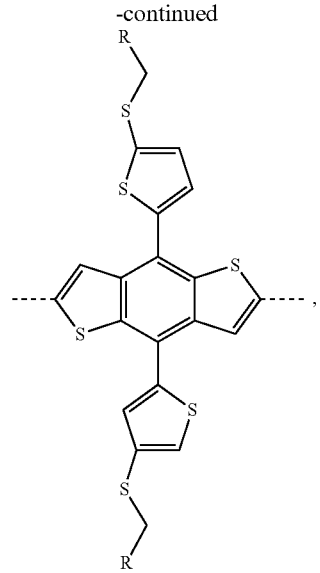
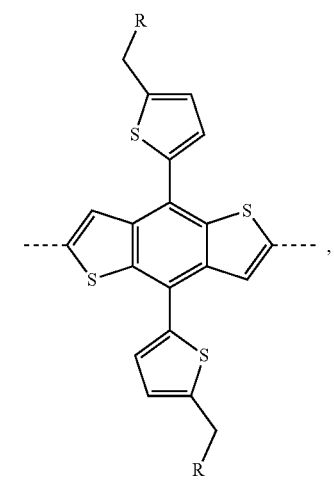
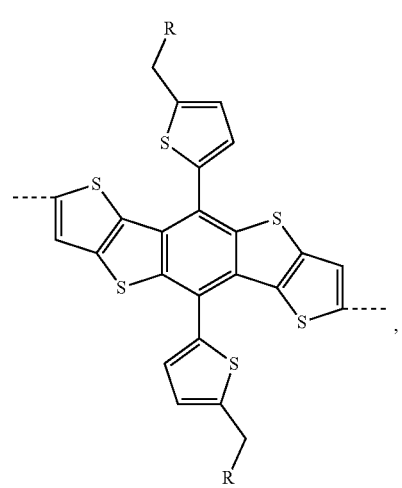

-continued

[Chemical structure of benzodithiophene with thiophene substituents bearing R groups]
, and

[Chemical structure of fused thiophene-benzene system with thiophene-SCH2R substituents]
, wherein each $Z_1$, $Z_2$, $Z_3$, $Z_4$, $Z_5$, and $Z_6$ is S, O, or Se;

each X, $X_1$, $X_2$, $X_3$, $X_4$, $X_5$, $X_6$, $X_7$, and $X_8$ is H, F, or Cl;

each R, $R_3$, and $R_4$ is independently selected from the group consisting of straight-chain, branched, and cyclic alkyl with 2-40 C atoms, wherein one or more non-adjacent C atoms are optically replaced by —O—, —S—, —C(O)—, —C(O—)—O—, —O—C(O)—, —O—C(O)—O—, —CR⁰=CR⁰⁰—, or —C≡C—, and wherein one or more H atoms are optionally replaced by F, Cl, Br, I, or CN or denote aryl, heteroaryl, aryoxy, heteroaryloxy, arycarbonyl, heteroarycarbonyl, arycarbonyloxy, heteroarylcarbonyloxy, aryxycarbonyl, or heteroaryloxycarbonyl having 4 to 30 ring atoms unsubstituted or substituted by one or more non-aromatic groups, wherein R⁰ and R⁰⁰ are independently a straight-chain, branched, or cyclic alkyl group.

In an embodiment, the donor polymer comprises one or more repeating units of the following formula:

[Chemical structure of benzodithiophene with thiophene substituents and thieno-thiophene ester group]

wherein each R is independently selected from the group consisting of straight-chain, branched, and cyclic alkyl groups with 2-40 C atoms;

each X is O, S or Se; and each Y is H, F, or Cl.

In an embodiment, the donor polymer comprises one or more repeating units of the following formula:

[Chemical structure of polymer repeat unit with benzodithiophene and fluorinated thieno-thiophene ester]$_n$ wherein n is an integer that is 1 or greater; and each R is independently selected from the group consisting of straight-chain, branched, and cyclic alkyl groups with 2-40 C atoms.

In an embodiment, at least one of the molecular acceptors comprises a unit having a formula selected from the group consisting of:

37 38
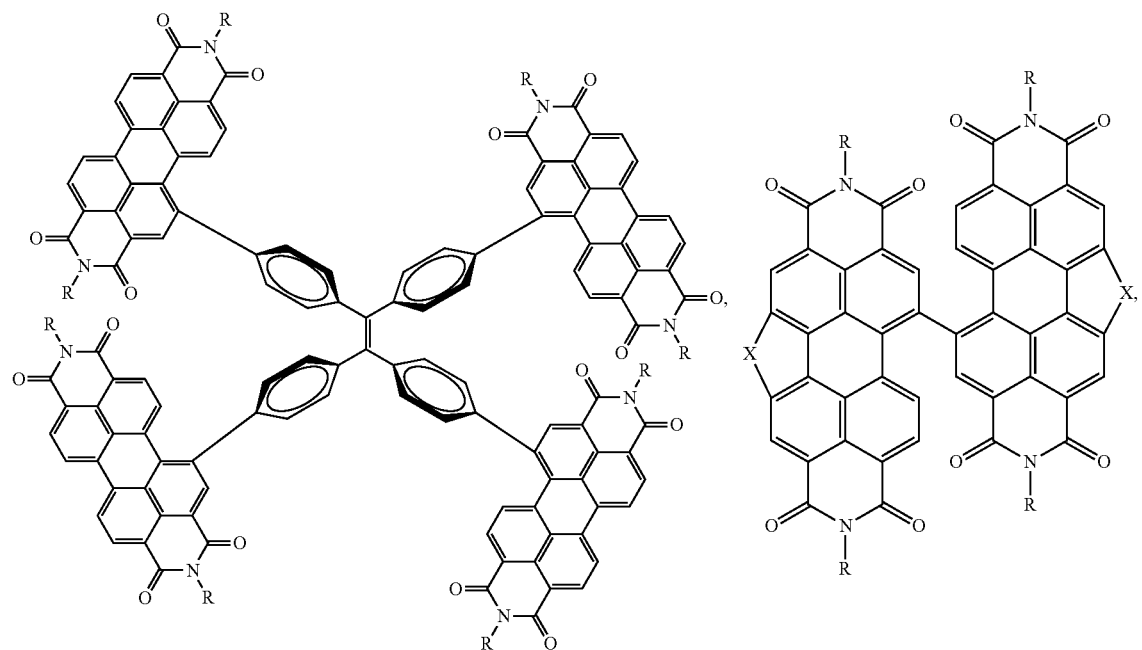

-continued
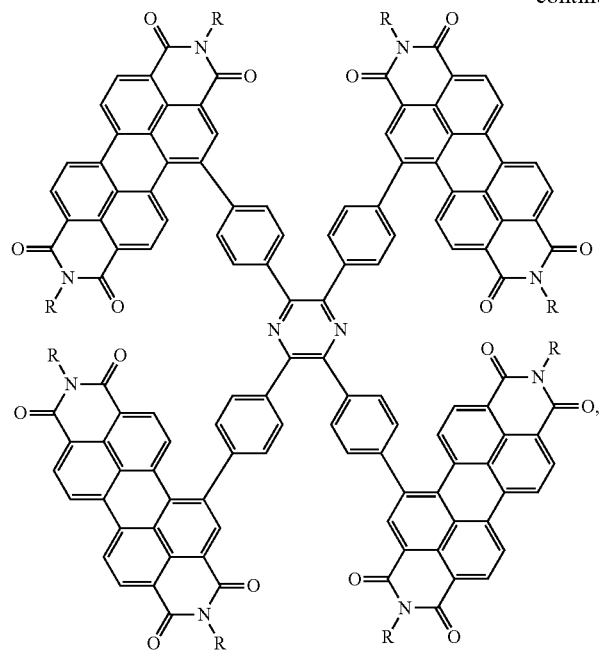
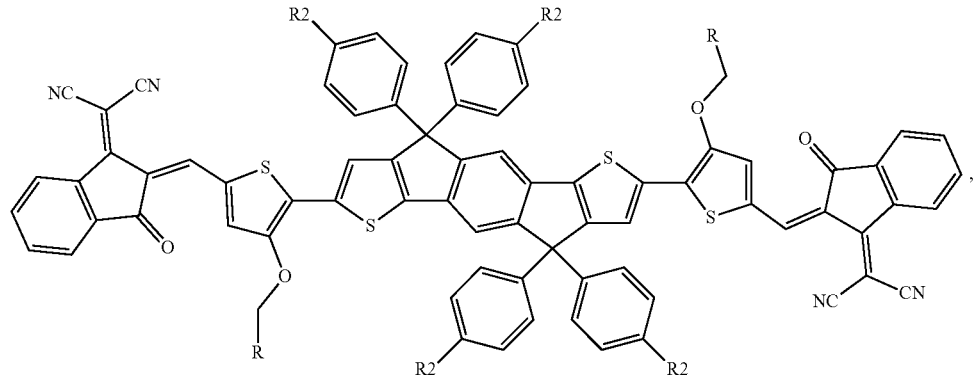
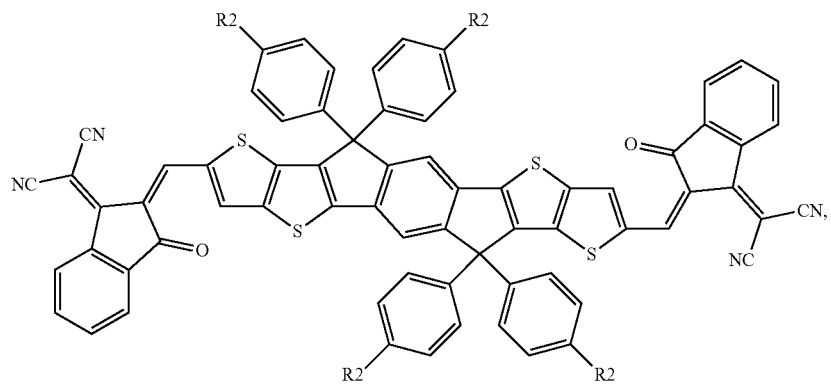

-continued
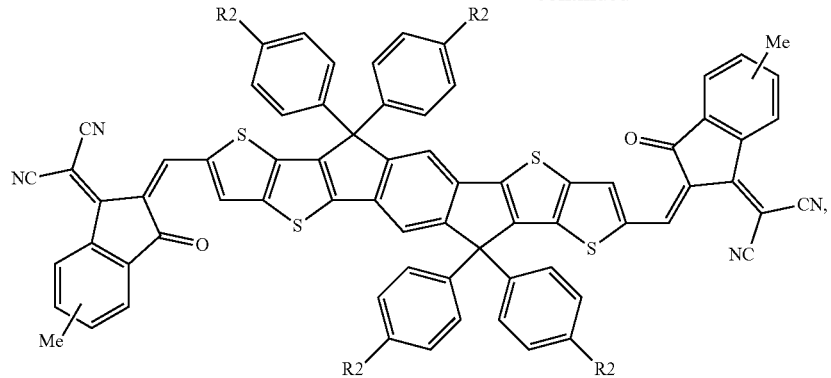
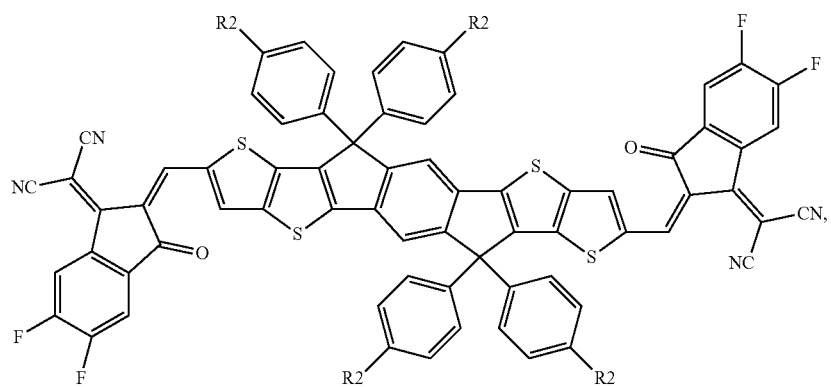
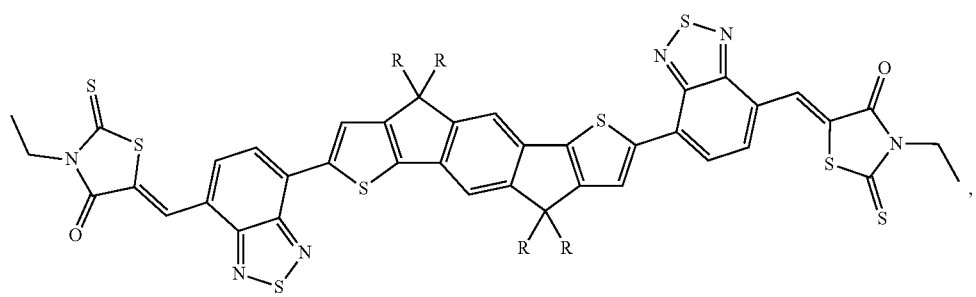
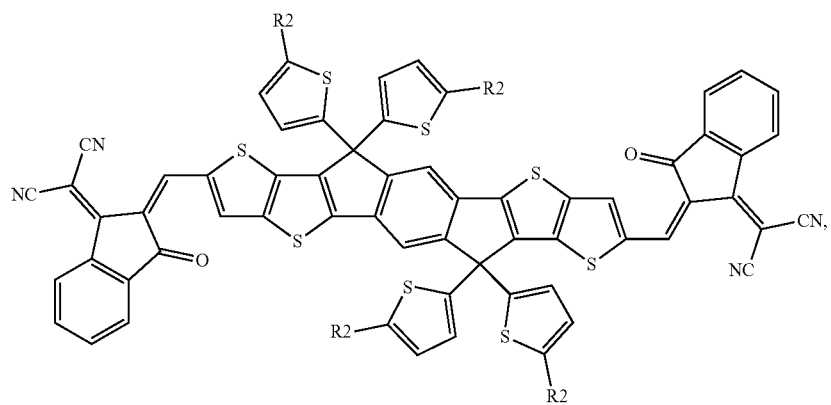

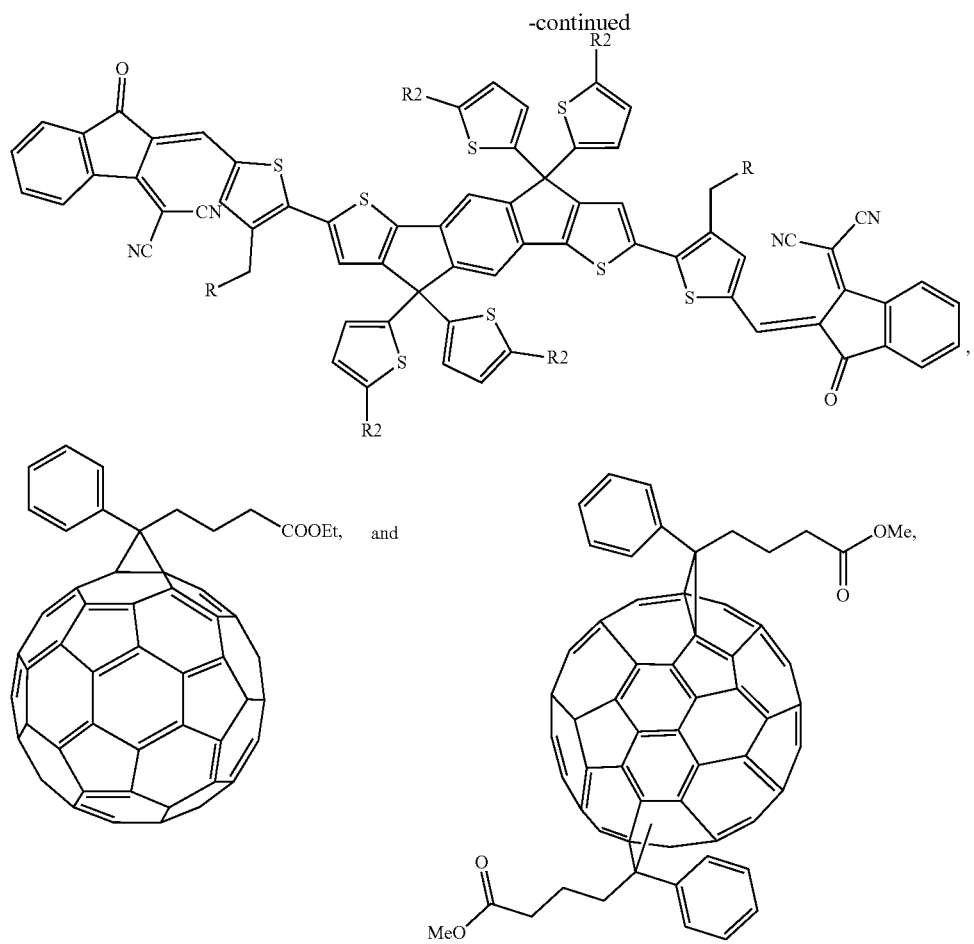

wherein each R and $R_2$ is independently selected from the group consisting of straight-chain, branched, and cyclic alkyl groups with 2-40 C atoms.

In an embodiment, a surface energy of the fullerene acceptor is higher than a surface energy of the donor polymer and a surface energy of the non-fullerene molecular acceptor.

In an embodiment, an organic solar cell comprising a photoactive layer that consists of at least one donor polymer and two non-fullerene molecular acceptors was demonstrated to perform efficiently.

In an embodiment, the present subject matter is directed to a formulation comprising:
- an organic solvent comprising one or more organic solvents;
- a small molecular material comprising one or more small molecular materials; and
- a conjugated polymer comprising one or more conjugated polymers;

wherein a solution comprising the conjugated polymer exhibits an onset of an optical absorption spectrum red shift of at least 80 nm when cooled from 100° C. to room temperature; and
wherein at least three combined small molecular materials and conjugated polymers are present.

In an embodiment, the small molecular material of the present subject matter comprises two or more small molecular non-fullerene acceptors. In an embodiment, the small molecular material comprises two or more small molecular materials comprising fullerene and non-fullerene acceptors.

In an embodiment, the formulation of the present subject matter comprises one conjugated polymer and two small molecular materials.

In an embodiment, the conjugated polymer of the present subject matter contains second position branched alkyl chains between two thiophene units. In an embodiment, the conjugated polymer containing second position branched alkyl chains between two thiophene units has a structure of:

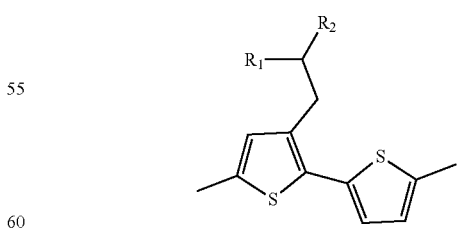

wherein each $R_1$ and $R_2$ is independently a straight-chain alkyl chain with 1-40 C atoms.

In an embodiment, the conjugated polymer containing second position branched alkyl chains between two thiophene units has a structure of:

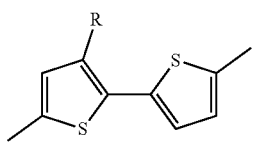

wherein R is a 2-position branched alkyl chain selected from the group consisting of

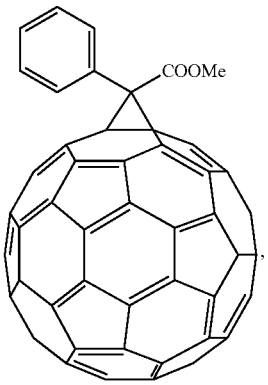

In an embodiment, a difference in surface energy between the one or more small molecular materials of the present subject matter is within 20%. In an embodiment, the one or more small molecular materials form an alloy.

In an embodiment, one of the one or more small molecular materials of the present subject matter is a fullerene. In an embodiment, the fullerene is selected from the group consisting of:

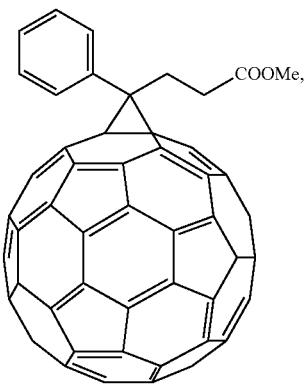

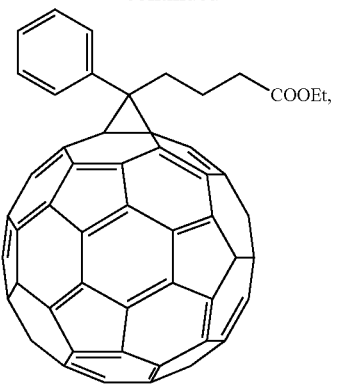 [SMILES: CCOC(=O)CCCC1(c2ccccc2)C2c3cc4cc5c6c4c4c3c3c7c8c9c%10c(cc%11c%12c%13c(cc(c%14c%13c%13c(c%12%10)c9c3c4c%13c6%14)C5)C%11)CC8=CC721]

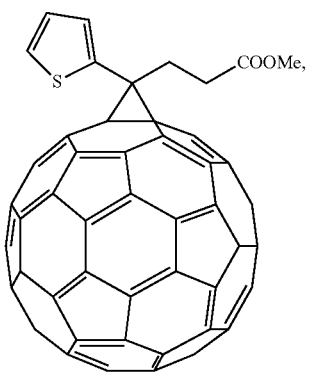

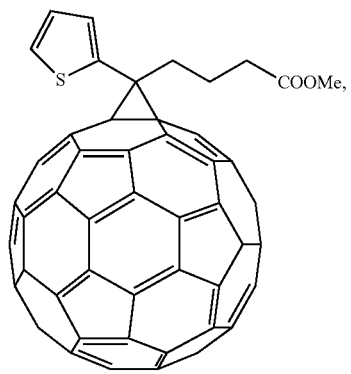

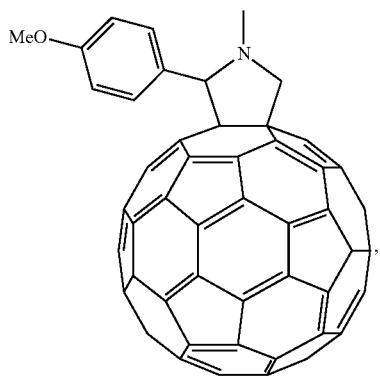

-continued
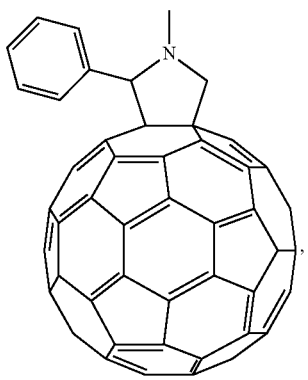
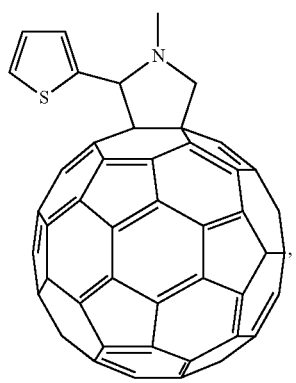
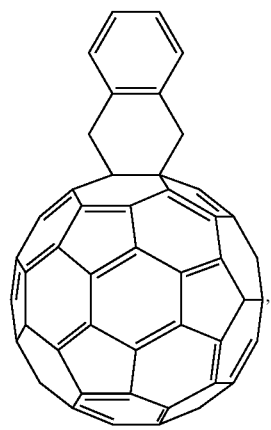
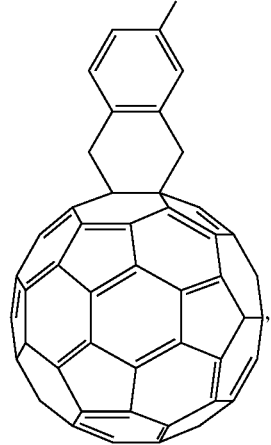
-continued
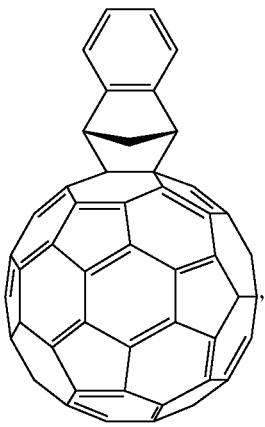
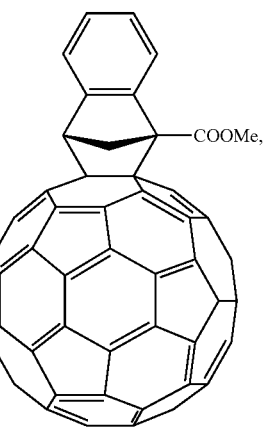
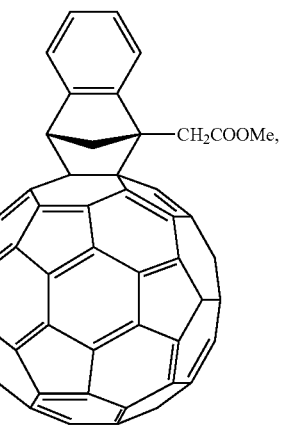
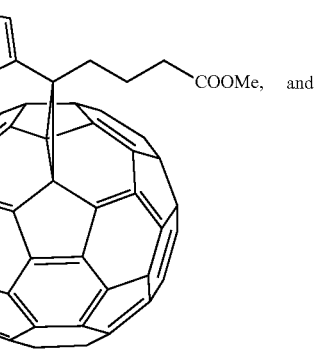 and

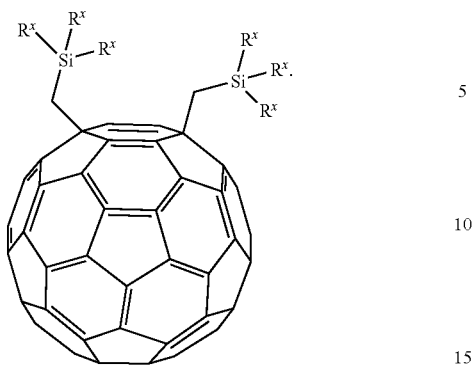
In an embodiment, the formulation is further characterized in that the conjugated polymer has an optical bandgap of 1.8 eV or lower, or more preferably, 1.65 eV or lower.
In an embodiment, the one or more conjugated polymers of the present subject matter is selected from the group consisting of:
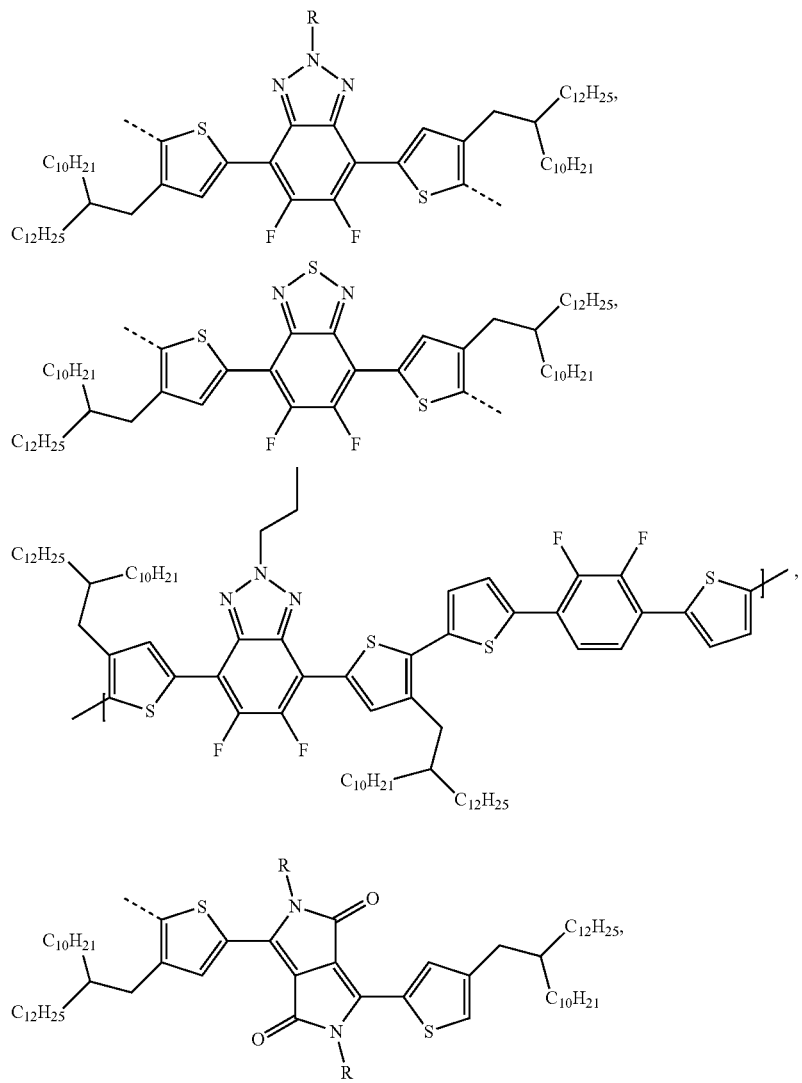

-continued
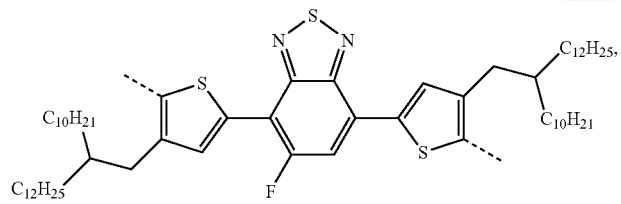
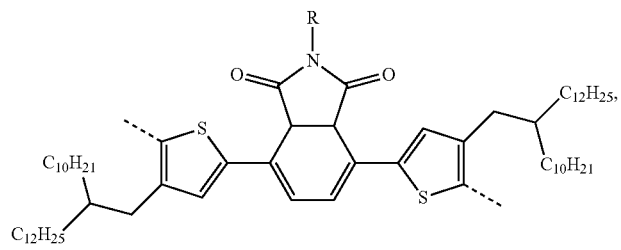
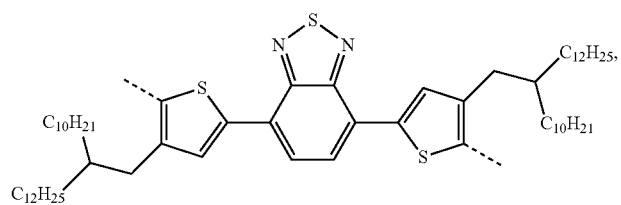
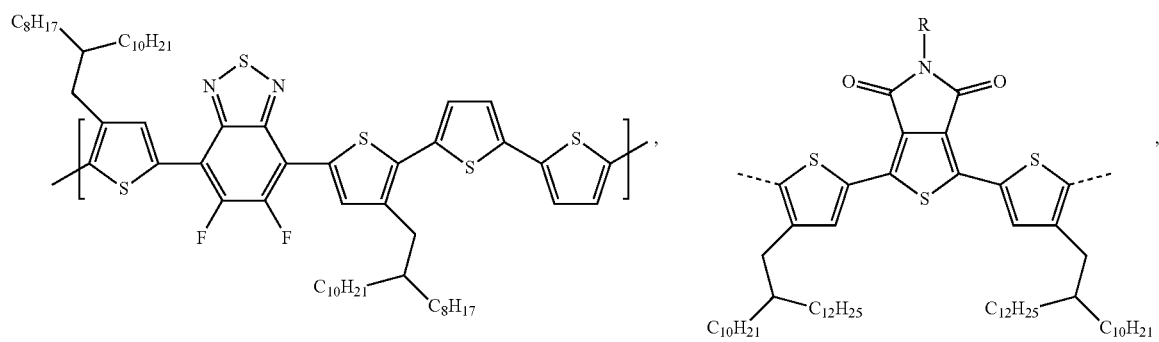
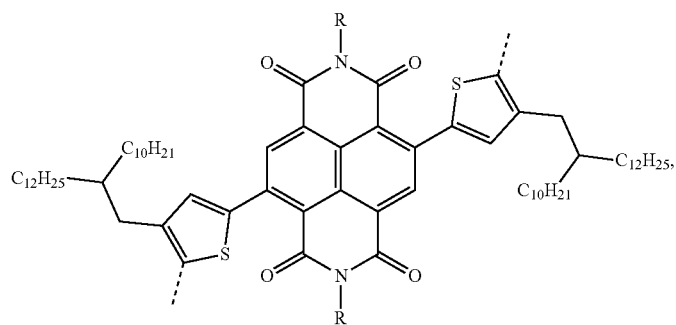

-continued

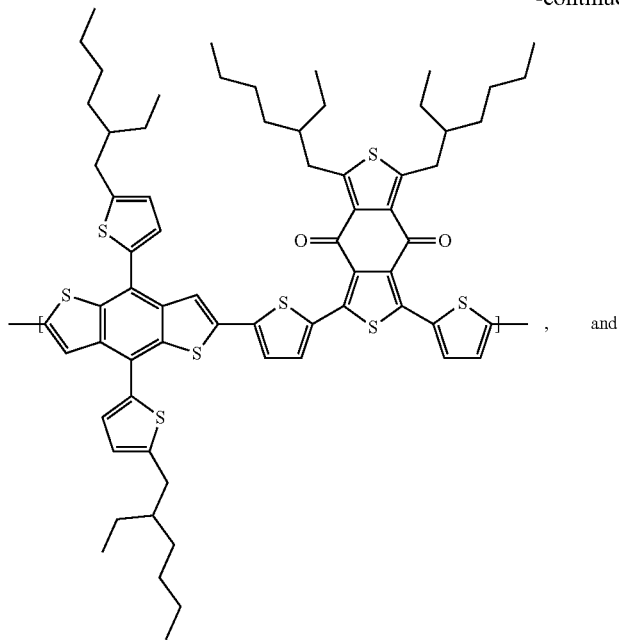
, and

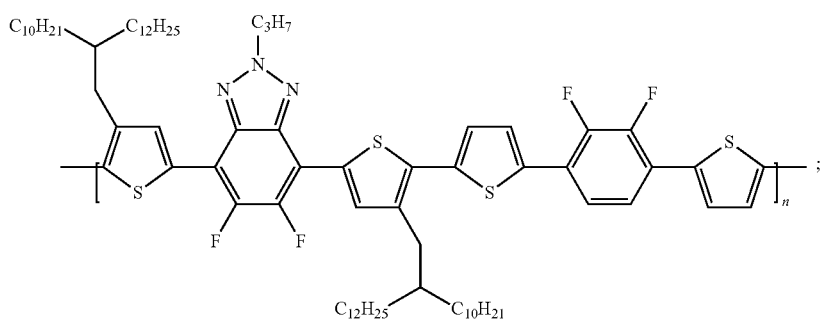

wherein
n is an integer,
each R is independently selected from the group consisting of straight-chain alkyl, branched alkyl, and cyclic alkyl,
the straight-chain alkyl, branched alkyl, and cyclic alkyl comprise 2-40 C atoms,
one or more non-adjacent C atoms are optically replaced by —O—, —S—, —C(O)—, —C(O—)—O—, —O—C(O)—, —O—C(O)—O—, —CR$^o$=CR$^{oo}$—, or —C≡C—,
one or more H atoms are optionally replaced by F, Cl, Br, I, or CN or denote aryl, heteroaryl, aryoxy, heteroaryloxy, arycarbonyl, heteroarycarbonyl, arycarbonyloxy, heteroarylcarbonyloxy, aryxycarbonyl, or heteroaryloxycarbonyl having 4 to 30 ring atoms unsubstituted or substituted by one or more non-aromatic groups, and
each R$^o$ and R$^{oo}$ is independently a straight-chain, branched, or cyclic alkyl group.

In an embodiment, the one or more small molecular materials are selected from the group consisting of:

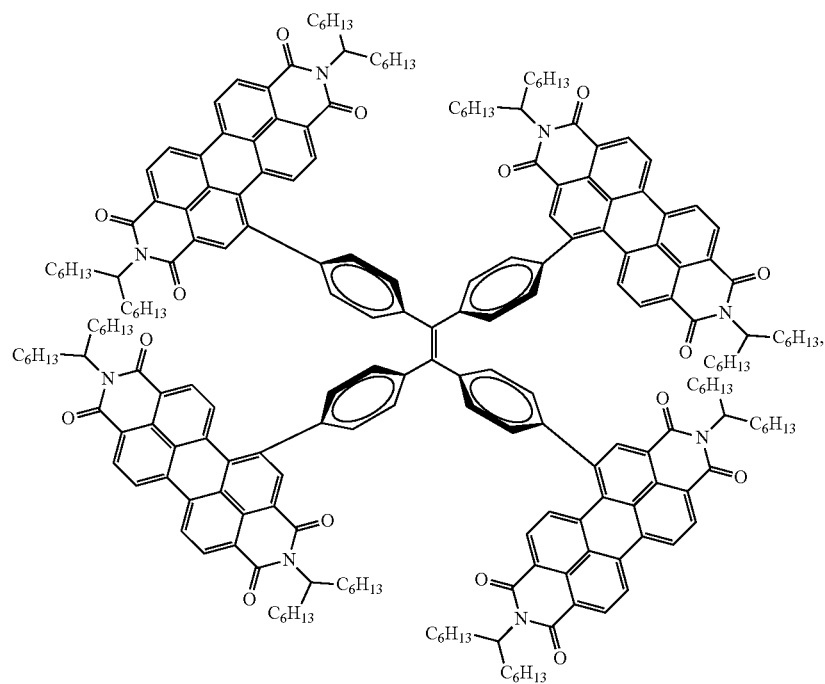
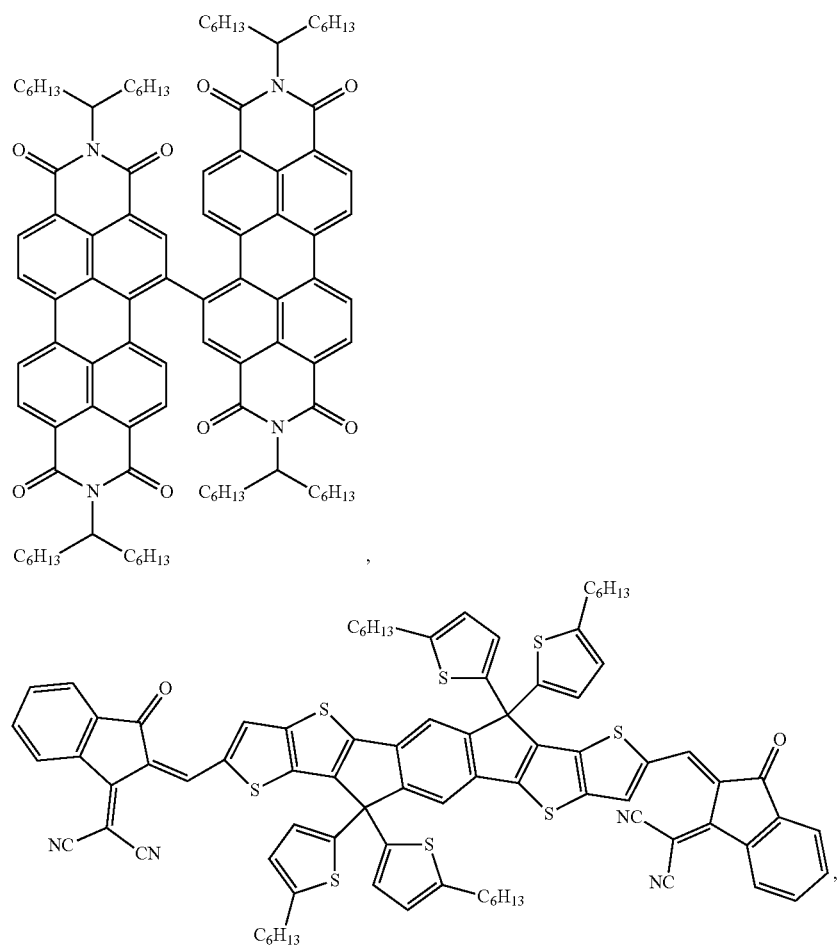

-continued

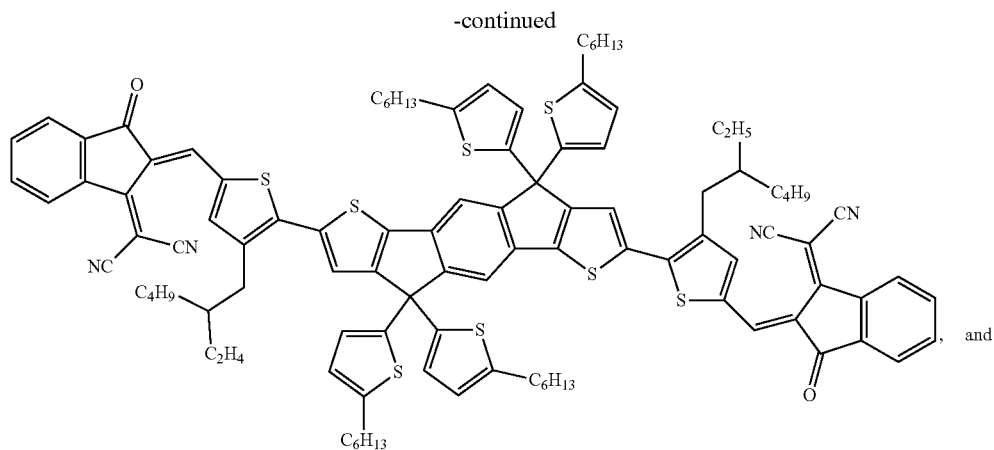

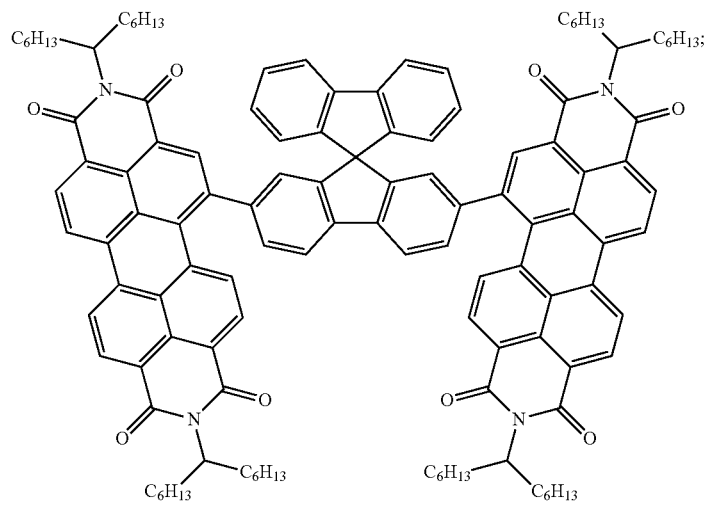

, and wherein
one or more non-adjacent C atoms are optionally replaced by —O—, —S—, —C(O)—, —C(O—)—O—, —O—C(O)—, —O—C(O)—O—, —CR⁰=CR⁰⁰—, or —C≡C—,
one or more H atoms are optionally replaced by F, Cl, Br, I, or CN or denote aryl, heteroaryl, aryloxy, heteroaryloxy, arylcarbonyl, heteroarylcarbonyl, arylcarbonyloxy, heteroarylcarbonyloxy, aryloxycarbonyl, or heteroaryloxycarbonyl having 4 to 30 ring atoms unsubstituted or substituted by one or more non-aromatic groups, and
each $R^o$ and $R^{oo}$ is independently a straight-chain, branched, or cyclic alkyl group.

In an embodiment, the present subject matter is directed to a ternary blend organic solar cell (OSC) comprising the present formulation. In an embodiment of the present subject matter, the formulation is further characterized in that the conjugated polymer has an optical bandgap of 1.8 eV or lower. More preferably, the optical bandgap is 1.65 eV or lower.

In an embodiment, the present subject matter is directed to an organic electronic (OE) device comprising a coating or printing ink comprising the present formulation. In an embodiment, the OE device is an organic field effect transistor (OFET) device. In an embodiment, the OE device is an organic solar cell (OSC) device. In an embodiment, the OSC device is a non-fullerene device having a power conversion efficiency of 11.3%.

In an embodiment, the chemical structures of PTFB-O, PBDB-T, PTB7-Th, ITIC-Th, ITIC, IEIC-Th, SF-PDI₂, IEIC-O, TPE-PDI₄, diPDI, IT-M, SdiPBI-Se, IDTBR, FBR, PC71BM, and Bis-PC$_{71}$BM are:

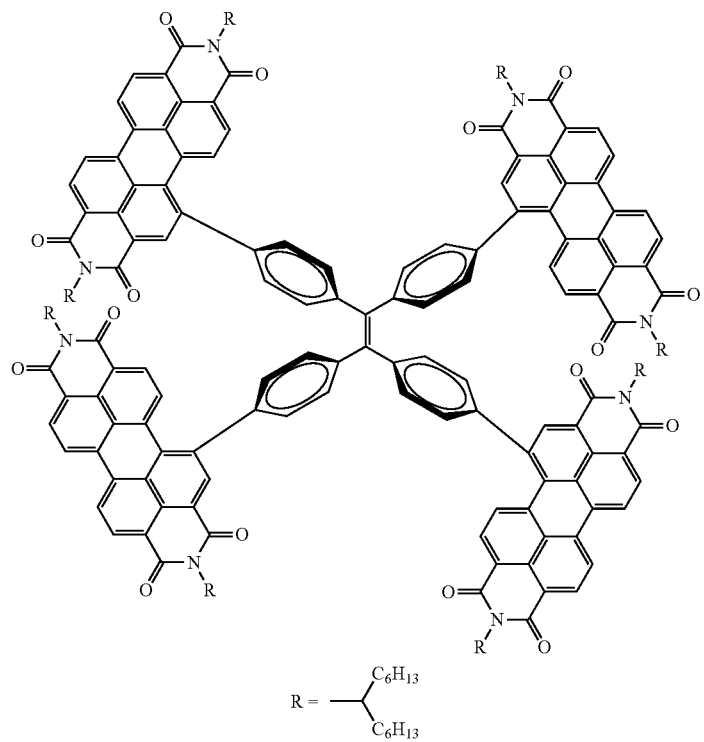
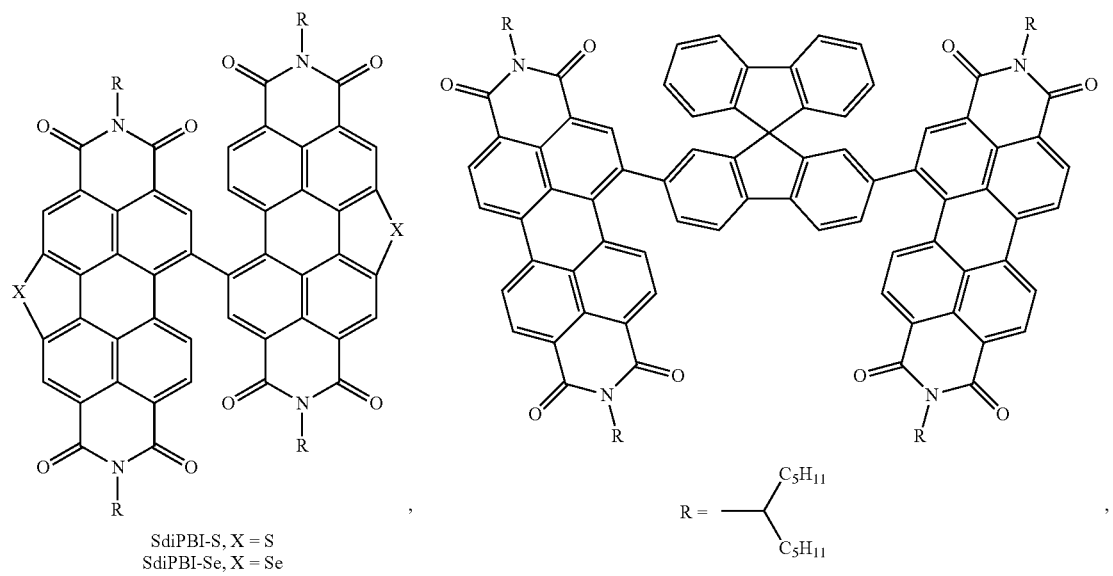
SdiPBI-S, X = S
SdiPBI-Se, X = Se

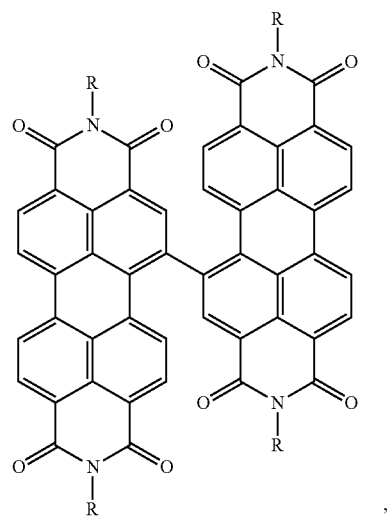
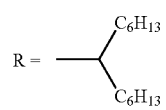
,
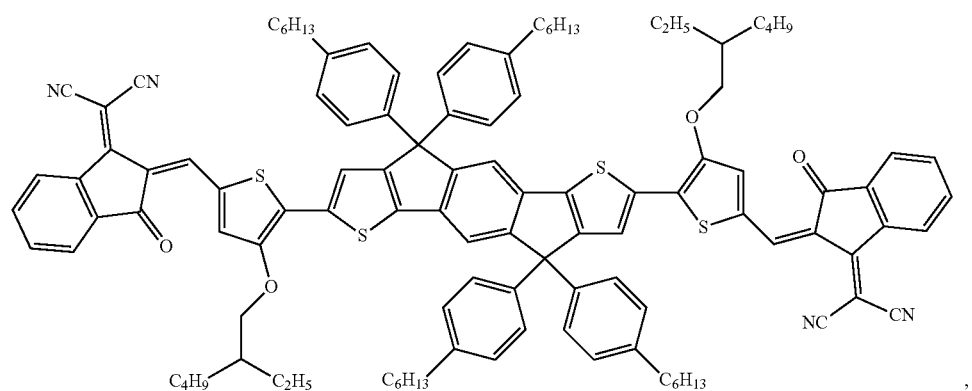
,
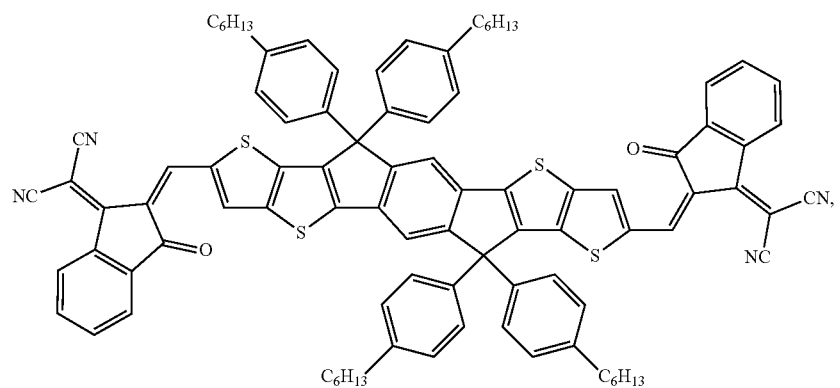

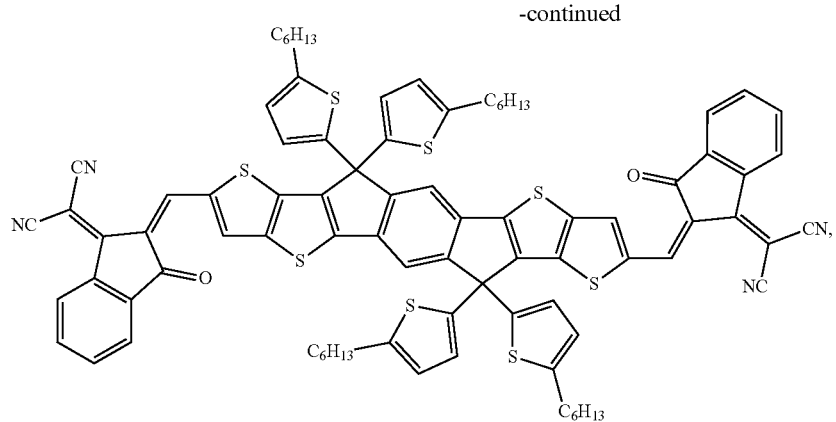
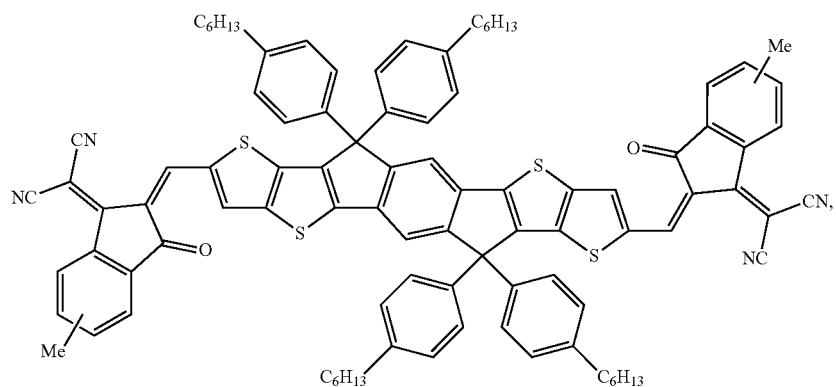
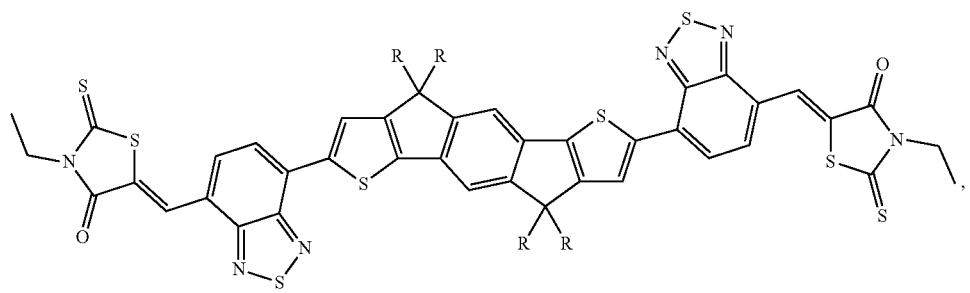
R = 2-ethylhexyl Or,
R = octyl
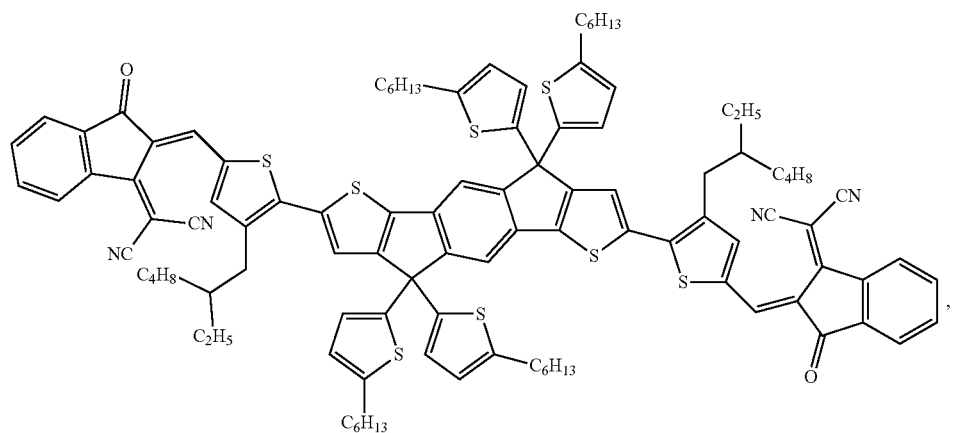

-continued
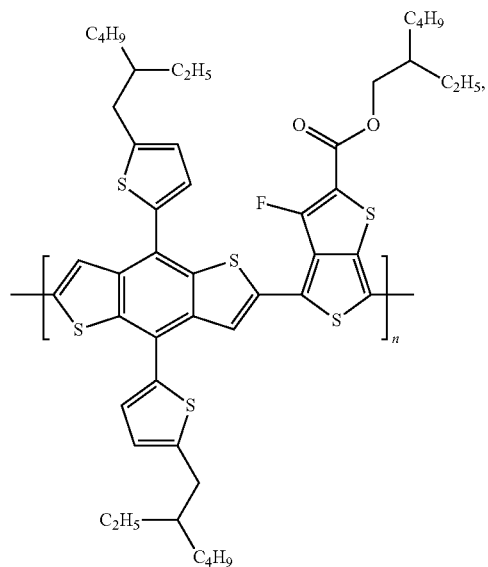
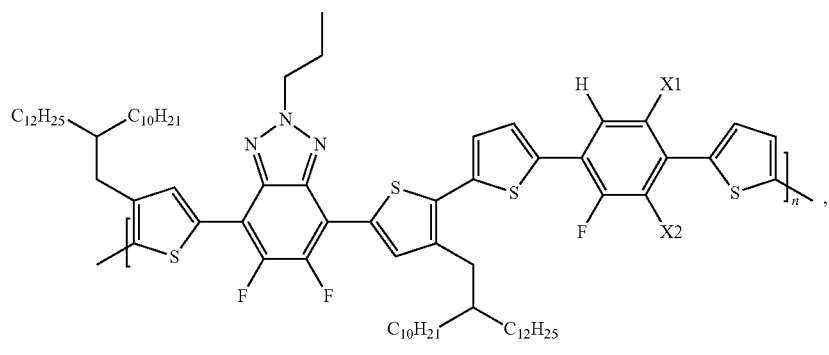
PTFB-O, X1 = H, X2 = F
PTFB-P, X2 = F, X1 = H
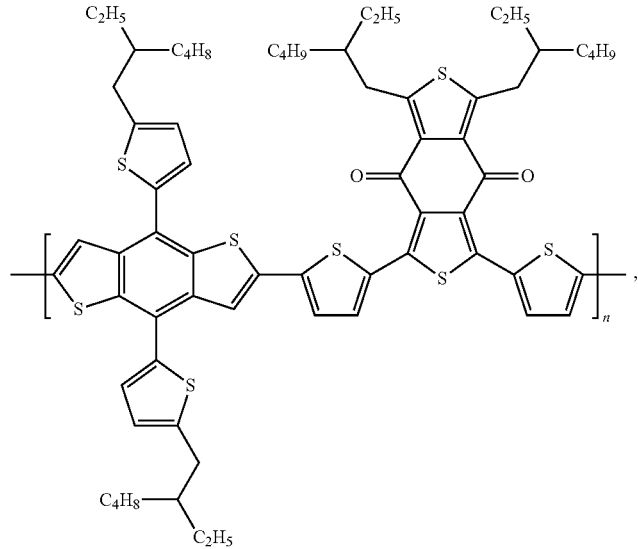

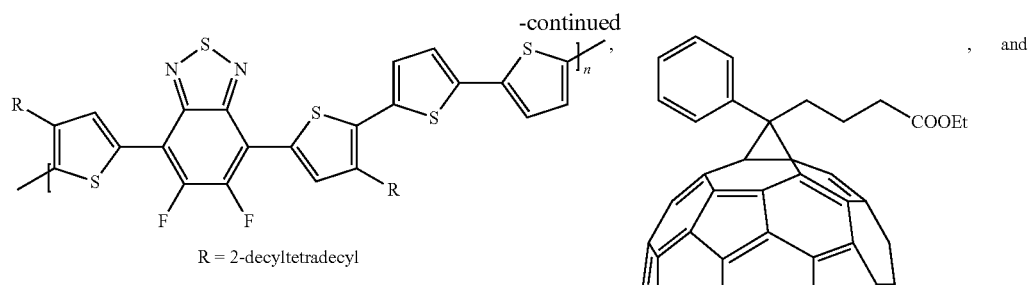
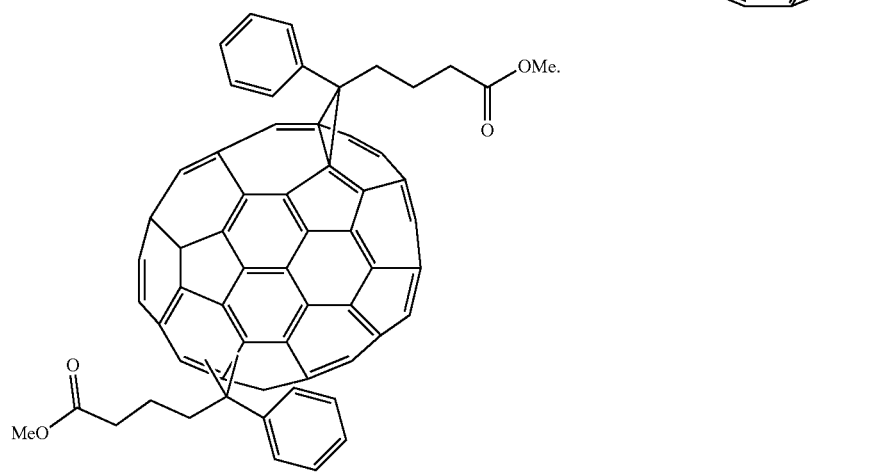
In an embodiment, the small molecular materials of the present subject matter are
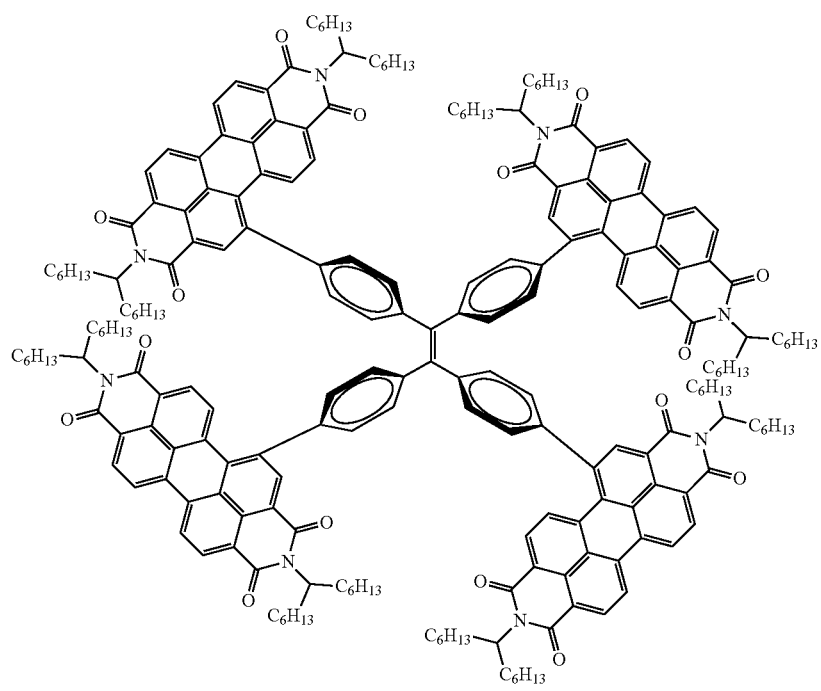
(TPE-PDI4)

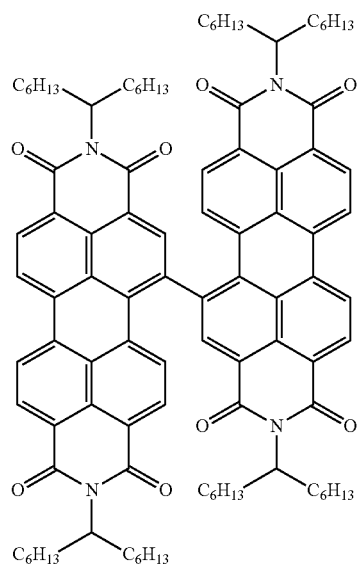
(diPDI)
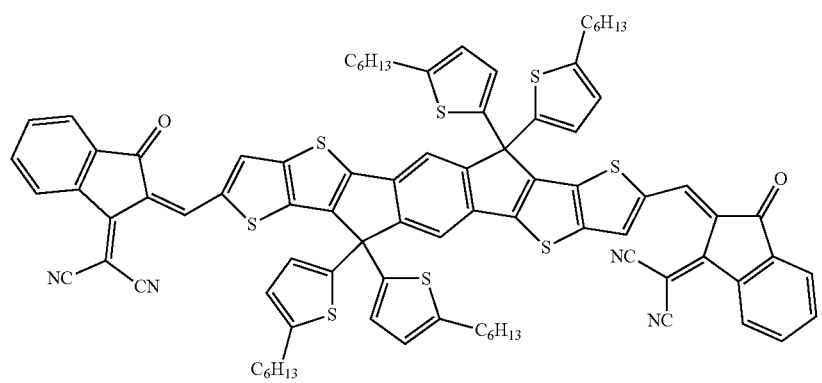
(ITIC-Th)
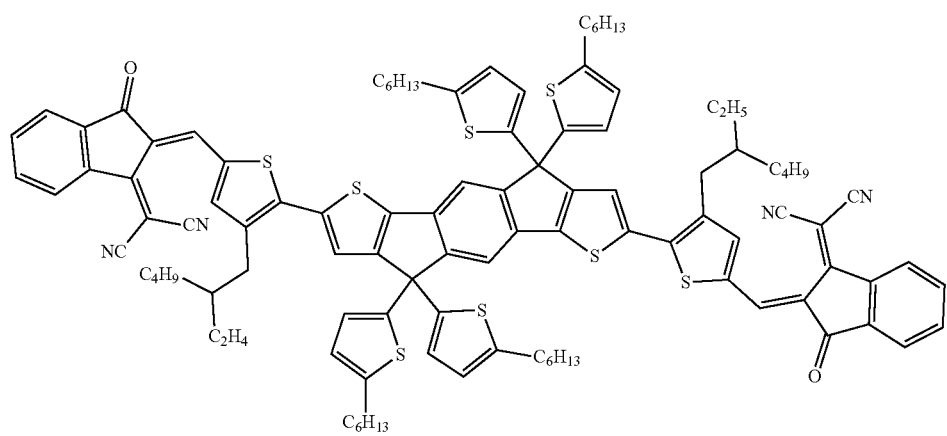
(IEIC-Th)

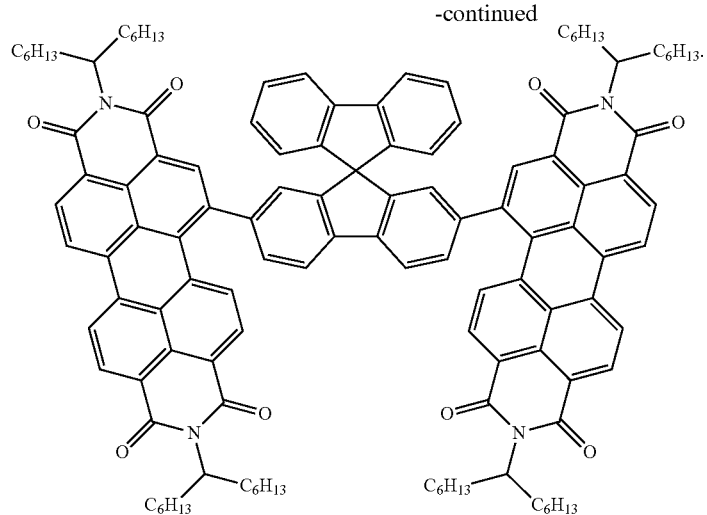
(SF-PDI₂)
In an embodiment, the conjugated polymer is PTFB-O or PBDT-T:
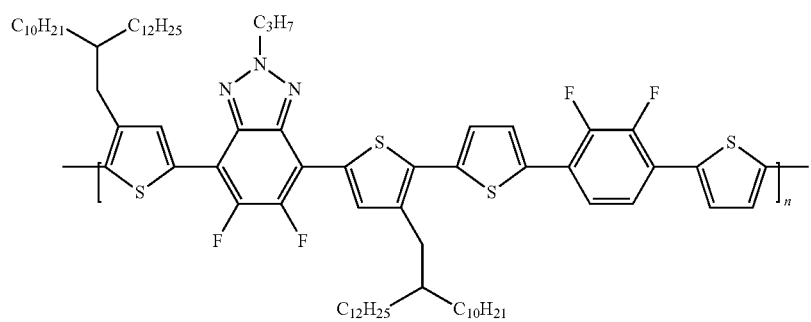
(PTFB-O)
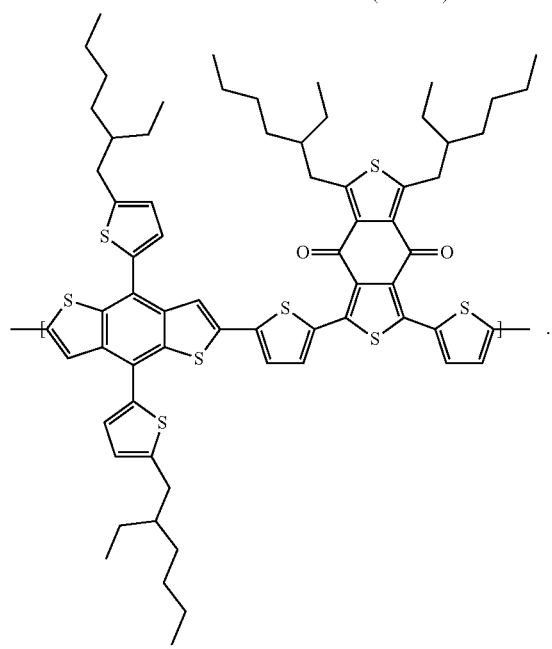
(PBDT-T)

In an embodiment, the fullerene is PC71BM:
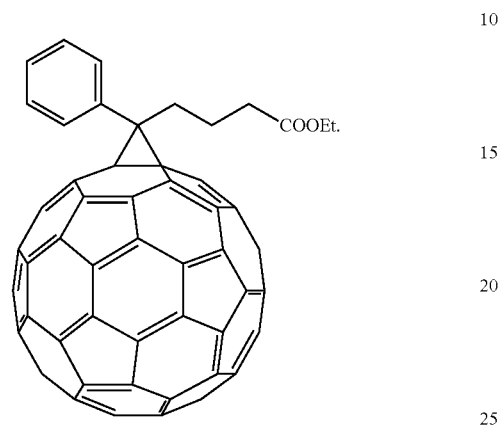
EXAMPLES
Example 1: Materials Selection and Synthesis
Preparation of donor materials and acceptor materials. These materials were selected from:
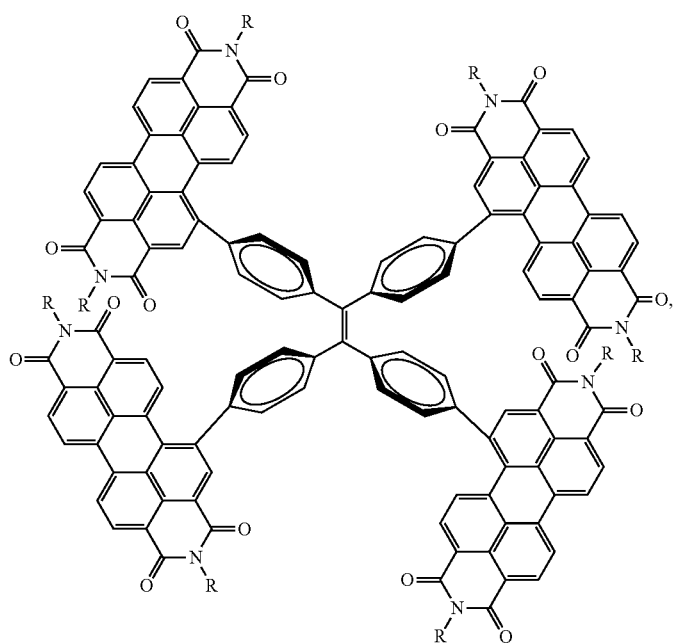

75
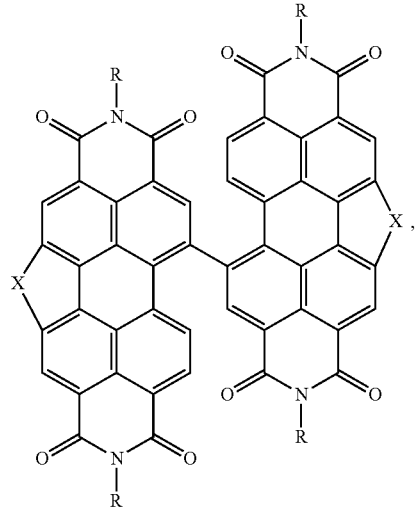
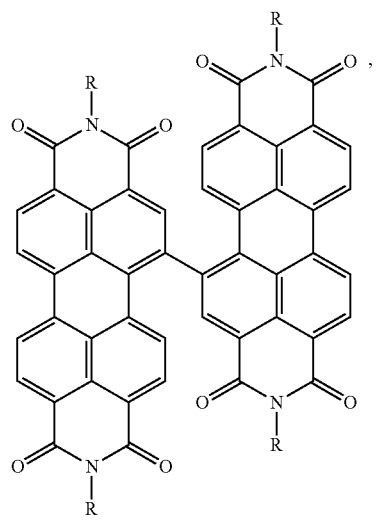
76
-continued
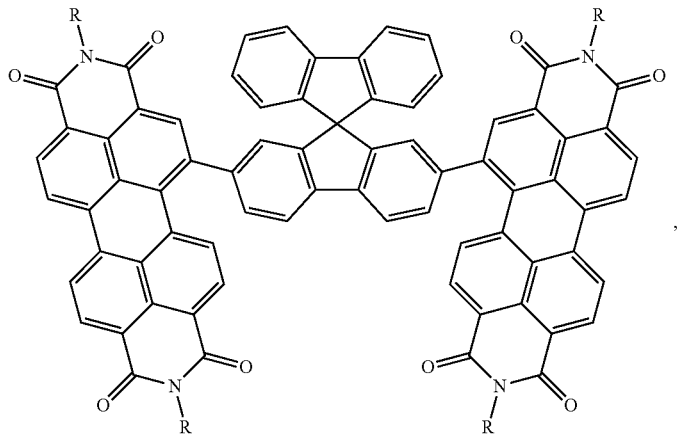
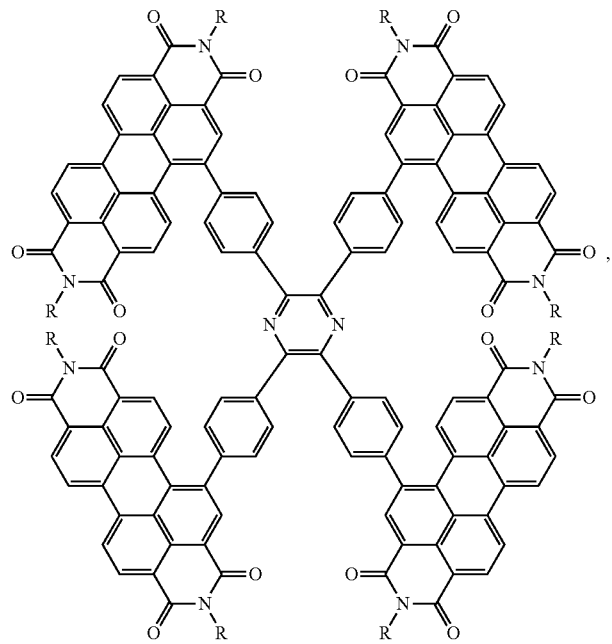

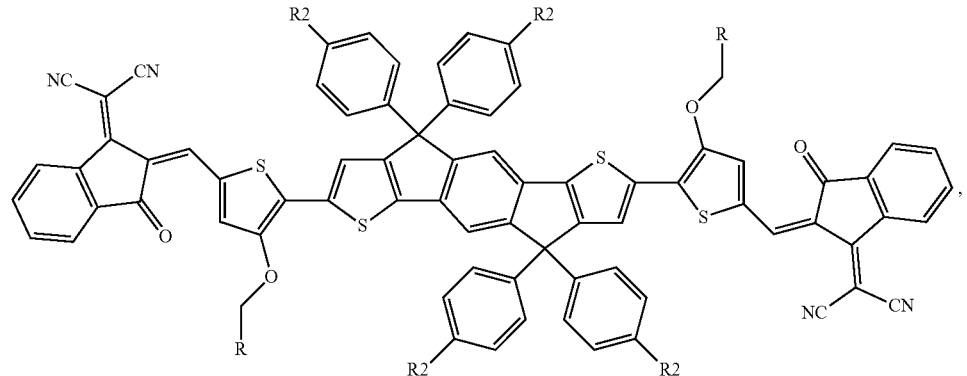
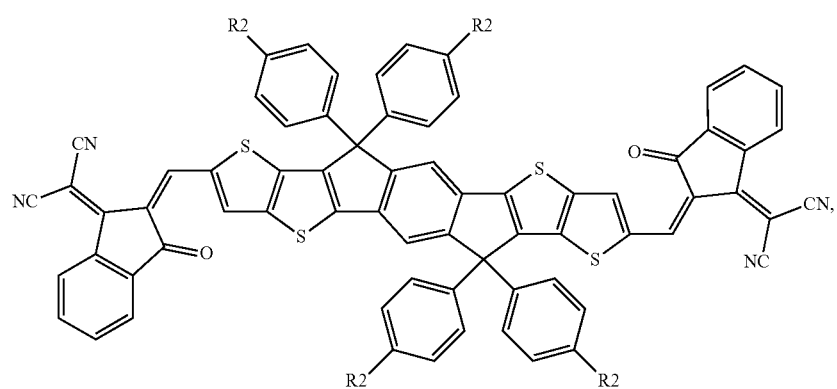
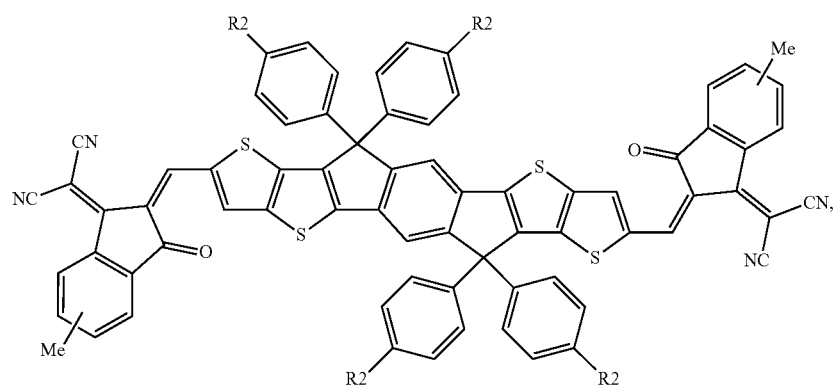
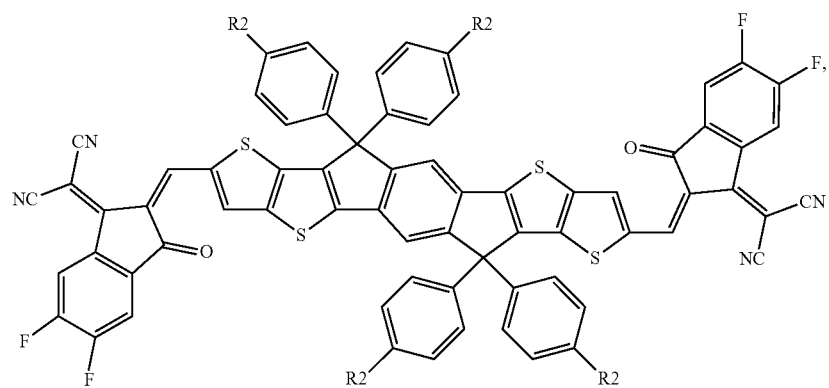

-continued

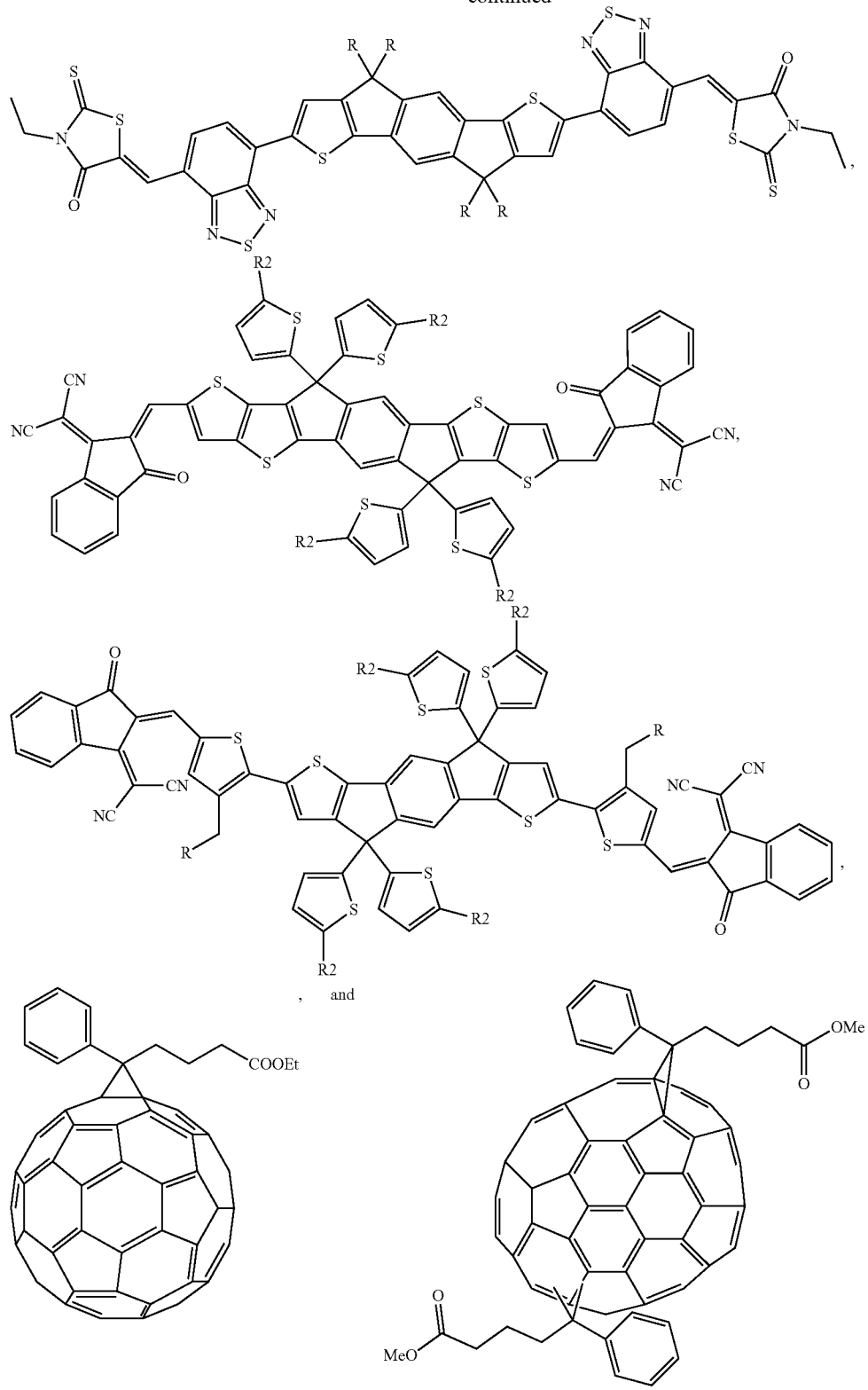

Example 2: Solar Cell Fabrication and Testing

Pre-patterned ITO-coated glass with a sheet resistance of ~15Ω per square was used as the substrate. It was cleaned by sequential ultrasonication in soap deionized water, deionized water, acetone, and isopropanol for 15 minutes at each step. The washed substrates were further treated with a UV—O₃ cleaner (Novascan, PSD Series digital UV ozone system) for 30 minutes. A topcoat layer of ZnO (A diethylzinc solution, 15 wt % in toluene, diluted with tetrahydrofuran) was spin-coated onto the ITO substrate at a spinning rate of 5000 rpm for 30 seconds and then baked in air at 150° C. for 20 minutes. Active layer solutions (polymer:SMAs weight ratio 1:1.5) were prepared in CB. The polymer concentration was 6 mg ml$^{-1}$ for PTFB-O. To completely dissolve the polymer, the active layer solution was stirred on a hot plate at 100° C. for at least 1 hour.

Before spin coating, both the polymer solution and ITO substrate were preheated on a hot plate at 100° C. Active layers were spin-coated from the warm polymer solution on the preheated substrate in a $N_2$ glovebox at 1500 r.p.m. The optimal ternary film thickness was 80-100 nm. The active layers were then treated with vacuum to remove the high boiling point additives. The blend films were annealed at 80° C. for 5 minutes before being transferred to the vacuum chamber of a thermal evaporator inside the same glovebox. At a vacuum level of $2\times10^{-6}$ Torr, a thin layer (20 nm) of $V_2O_5$ was deposited as the anode interlayer, followed by deposition of 100 nm of Al as the top electrode. All cells were encapsulated using epoxy inside the glovebox.

Device J-V characteristics were measured under AM1.5G (100 mW cm$^{-2}$) using a Newport Class A solar simulator (94021A, a Xenon lamp with an AM1.5G filter) in air at room temperature. A standard Si diode with KG5 filter was purchased from PV Measurements and calibrated by Newport Corporation. The light intensity was calibrated using the Si diode as a reference cell to bring spectral mismatch to unity. J-V characteristics were recorded using a Keithley 2400 source meter unit. Typical cells had a device area of 5.9 mm$^2$, which was defined by a metal mask with an aperture aligned with the device area. FIG. 1 shows the J-V curve.

Figure 2A:
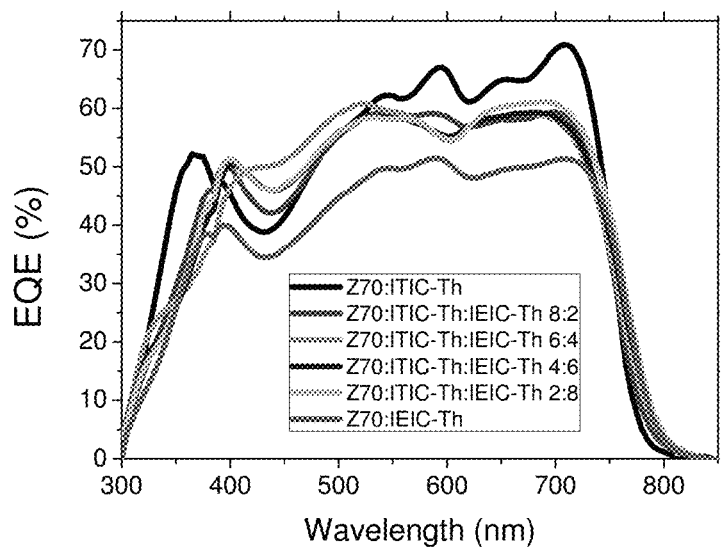
FIGS. 2A-C show the EQE curves of ternary solar cell.
Figure 2B:
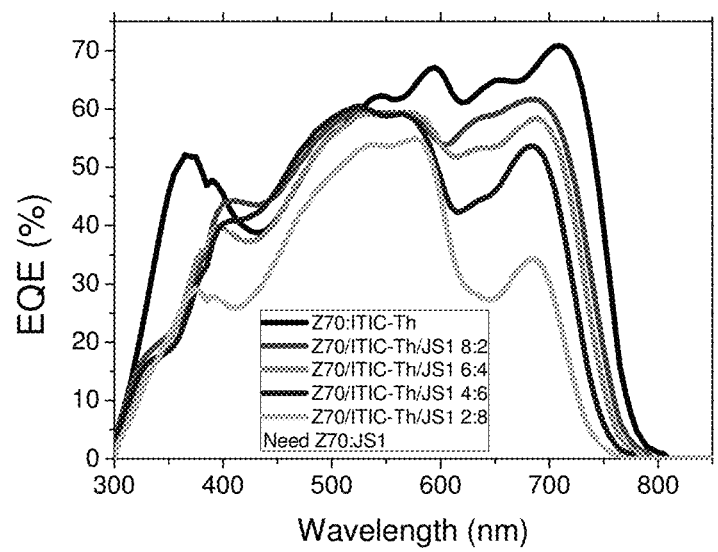
Figure 2C:
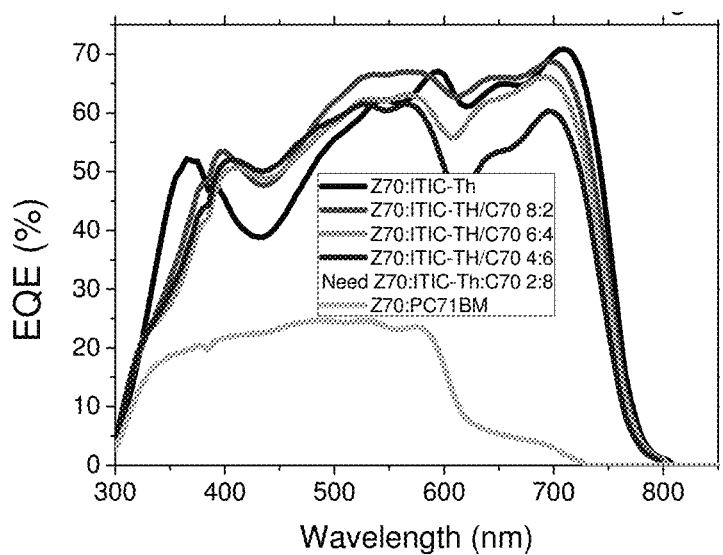

EQEs were characterized using a Newport EQE system equipped with a standard Si diode. Monochromatic light was generated from a Newport 300 W lamp source. FIGS. 2A-C show the EQE curves.

Example 3: AFM Analysis

AFM measurements were performed by using a Scanning Probe Microscope-Dimension 3100 in tapping mode. All film samples were spin-cast on ITO/ZnO substrates. FIGS. 6A-F show the AFM images.

Example 4: Characterization of Polymers and Devices

Optical Properties

Solution UV-Vis absorption spectra at elevated temperatures were collected on a Perkin Elmer Lambda 950 UV/VIS/NIR Spectrophotometer. The temperature of the cuvette was controlled with a Perkin Elmer PTP 6+6 Peltier System, which was supplied by a Perkin Elmer PCB 1500 Water Peltier System. Before each measurement, the system was held for at least 10 minutes at the target temperature to reach thermal equilibrium. A cuvette with a stopper (Sigma Z600628) was used to avoid volatilization during the measurement.

Film UV-Vis absorption spectra of polymers from Example 2 were acquired on a Perkin Elmer Lambda 20 UV/VIS Spectrophotometer. All film samples were spin-cast on ITO/ZnO substrates. Solution UV-Vis absorption spectra at elevated temperatures were collected on a Perkin Elmer Lambda 950 UV/VIS/NIR Spectrophotometer. The temperature of the cuvette was controlled with a Perkin Elmer PTP 6+6 Peltier System, which was supplied by a Perkin Elmer PCB 1500 Water Peltier System. Before each measurement, the system was held for at least 10 minutes at the target temperature to reach thermal equilibrium. A cuvette with a stopper (Sigma Z600628) was used to avoid volatilization during the measurement.

Figure 3A:
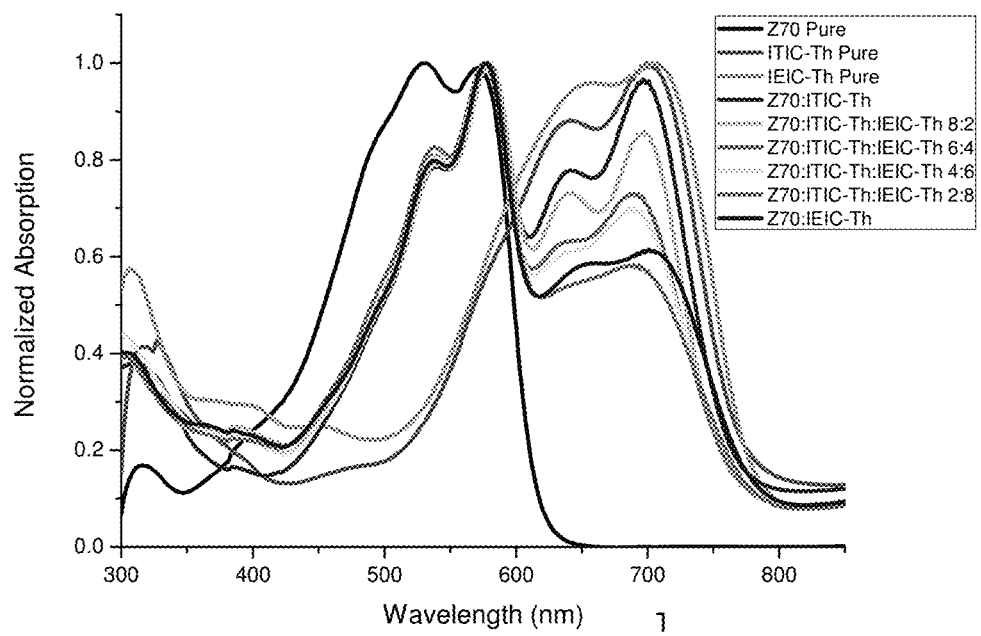
FIGS. 3A-C show the UV-Vis absorption spectra of ternary solar cell.
Figure 3B:
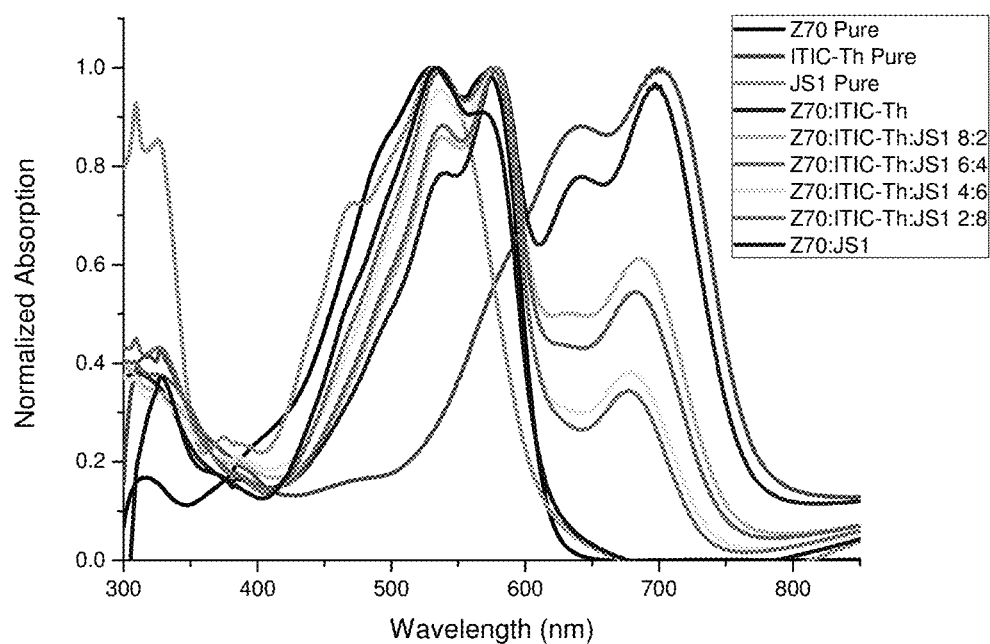
Figure 3C:
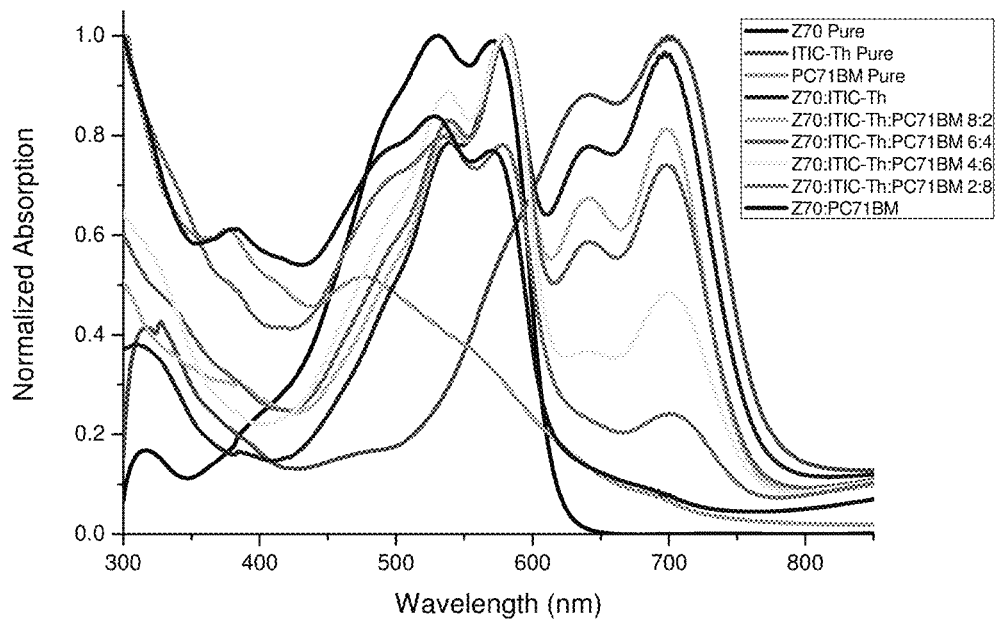

The onset of the absorption was used to estimate the polymer bandgap. FIG. 3A-C shows the optical absorption spectrum.

Electronic Properties

Cyclic voltammetry was carried out on a CHI760E electrochemical workstation with three electrodes configuration, wherein Ag/AgCl was used as the reference electrode, a Pt plate was used as the counter electrode, and a glassy carbon was used as the working electrode.

Polymers were drop-cast onto the electrode from DCB solutions to form thin films. 0.1 mol L$^{-1}$ tetrabutylammonium hexafluorophosphate in anhydrous acetonitrile was used as the supporting electrolyte. Potentials were referenced to the ferrocenium/ferrocene couple by using ferrocene as external standards in acetonitrile solutions. The scan rate was 0.05 V s$^{-1}$.

Figure 5:
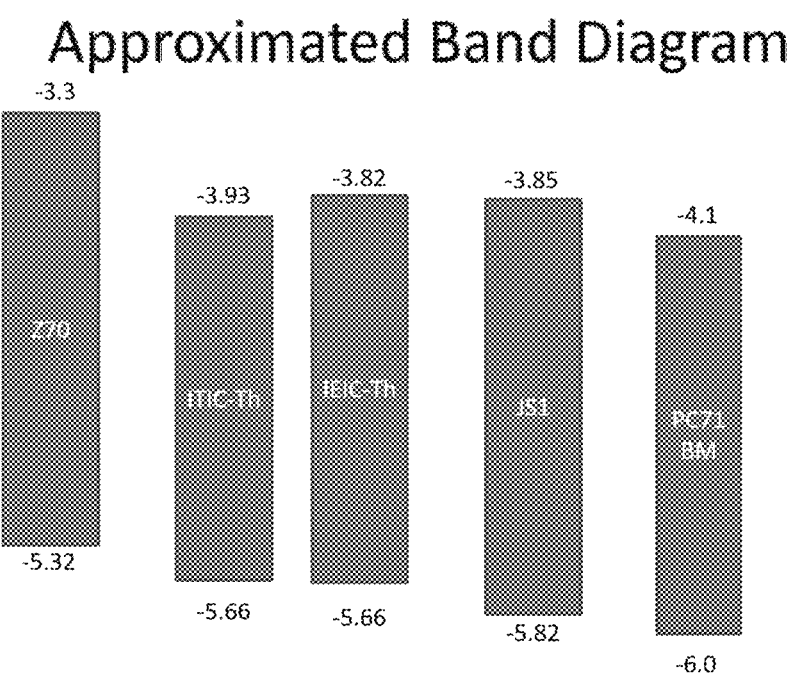
FIG. 5 shows the energy level of all materials in 0.1 M (n-Bu)4N+PF6− acetonitrile solution according to the present teaching measurement.
Figure 6A:
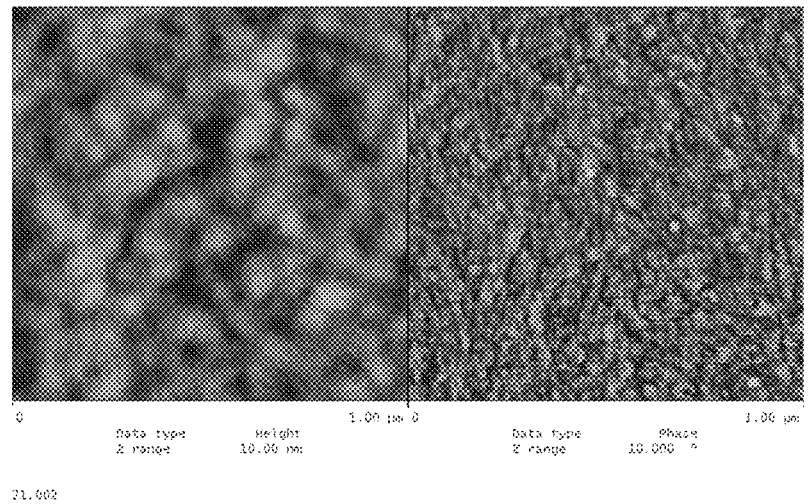
FIGS. 6A-F show the AFM (1×1 μm) images of ternary blend films containing different ration SMAs acceptor.
Figure 6B:
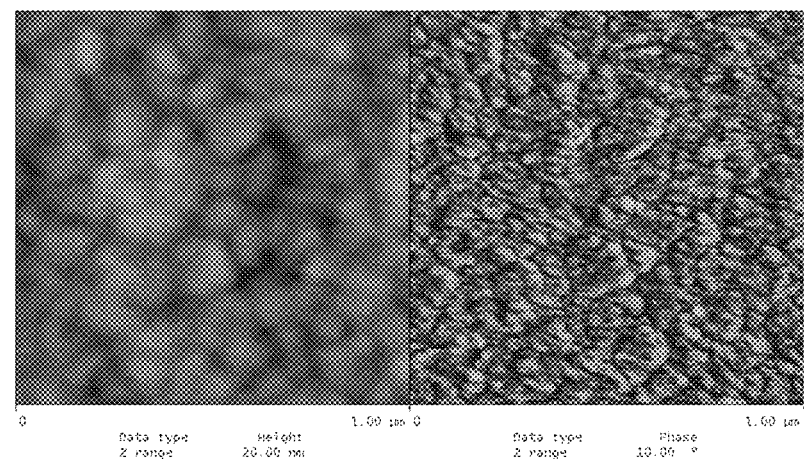
Figure 6C:
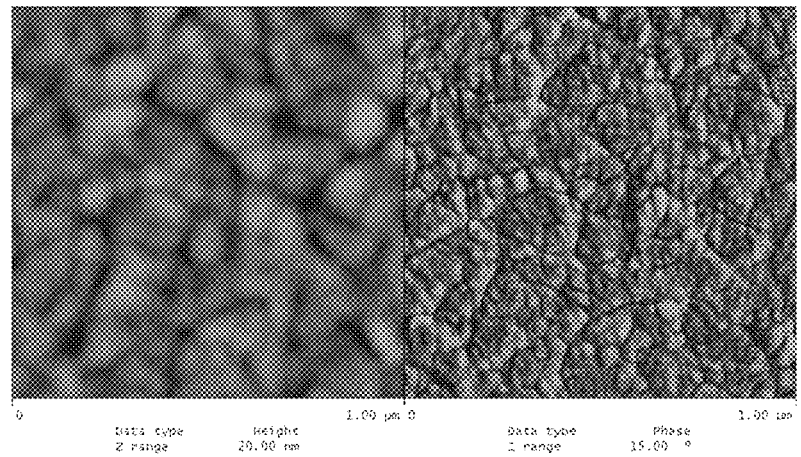
Figure 6D:
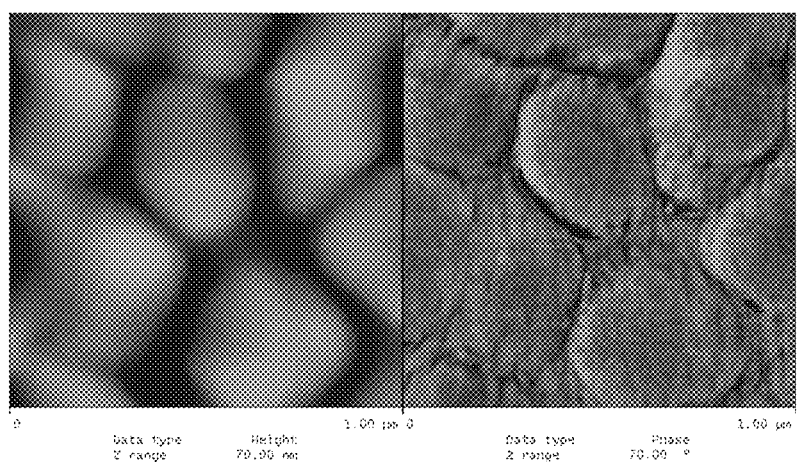
Figure 6E:
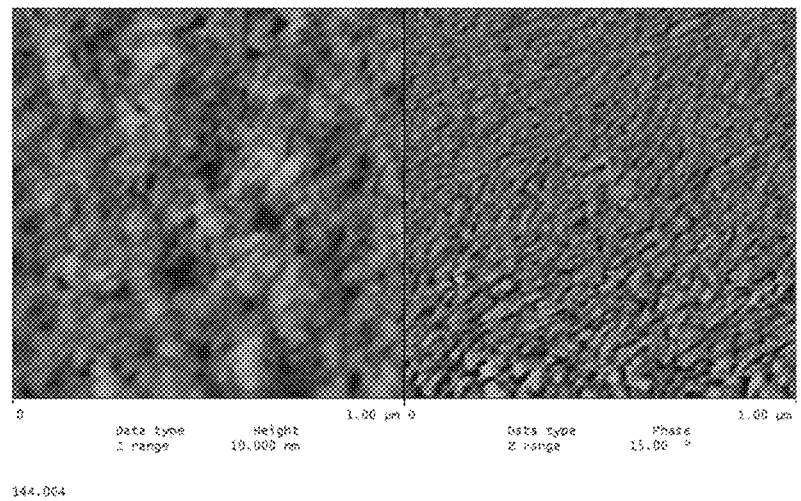
Figure 6F:
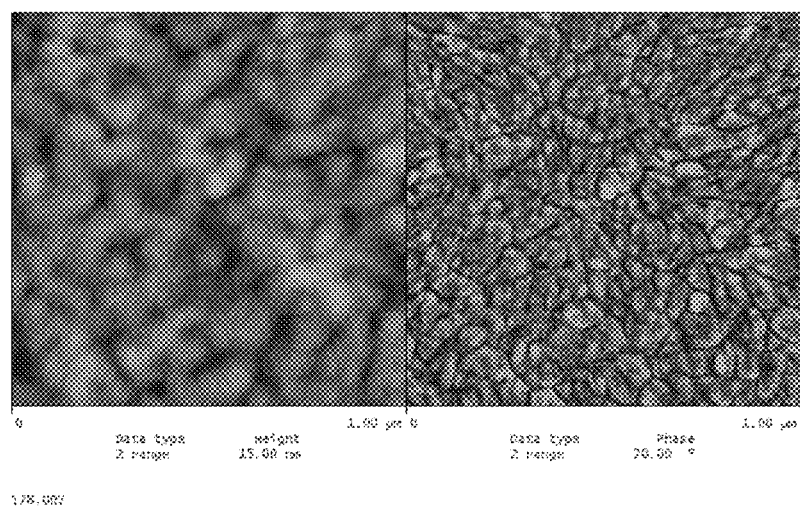
Figure 10:
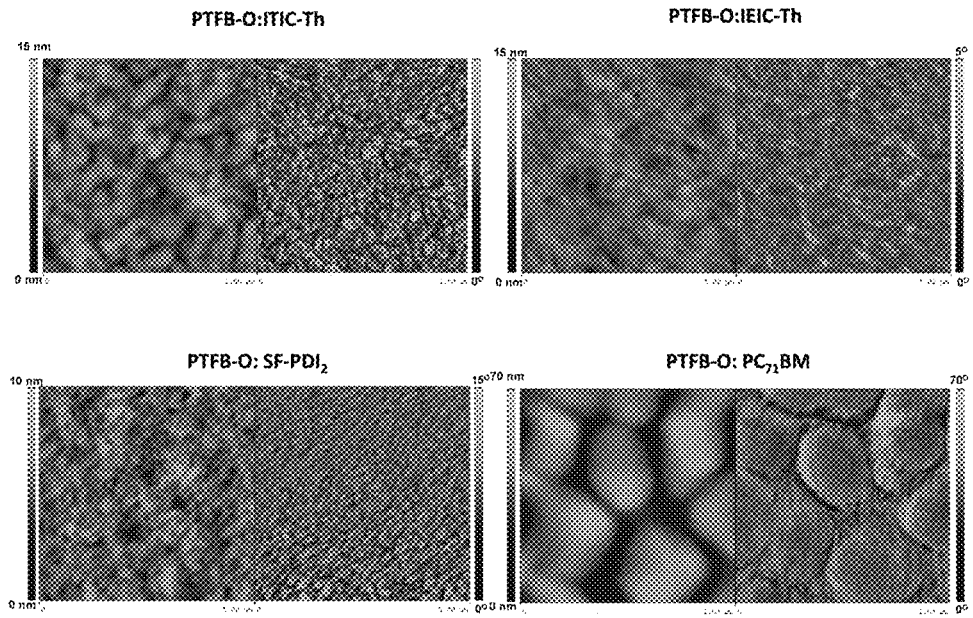
FIGS. 10A-D show atomic force microscopy (AFM) (1×1 μm) images for the PTFB-O:acceptor binary blend films.
Figure 11:
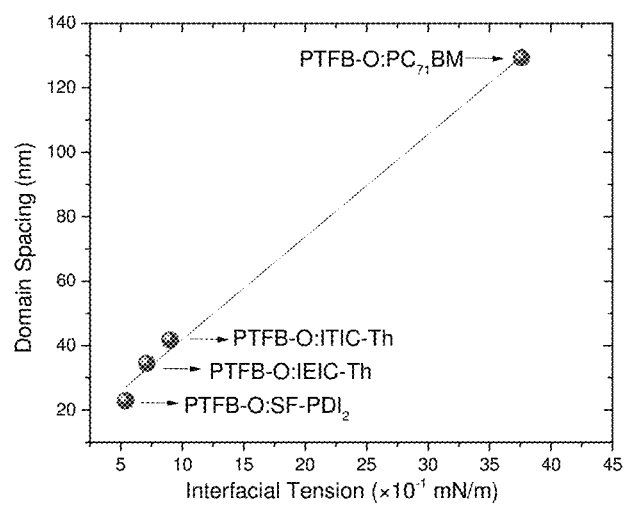
FIG. 11 shows a monotonic relationship is observed for these binary systems.

FIG. 5 shows the energy level of all materials in 0.1 M (n-Bu)4N+PF6- acetonitrile solution.

With the information contained herein, various departures and modifications from precise descriptions of the present subject matter will be readily apparent to those skilled in the art to which the present subject matter pertains, without departing from the spirit and the scope of the below claims. As such, the present subject matter is directed to any one or more of the embodiments, or elements thereof, described herein, or permutation or combination of some or all of the embodiments, or the elements thereof, described herein. The present subject matter is not considered limited in scope to the procedures, properties, or components defined, since the preferred embodiments and other descriptions are intended only to be illustrative of particular aspects of the presently provided subject matter.

We claim:

1. A ternary hybrid organic solar cell comprising a photoactive layer that comprises one donor polymer and two non-fullerene molecular acceptors, wherein:

the donor polymer exhibits temperature dependent aggregation (TDA) properties in solution, the absorption onset of the polymer solution exhibiting a red shift of at least 80 nm when the solution is cooled from 100° C. to room temperature or the absorption onset of the polymer solution exhibiting a red shift of at least 40 nm when the solution is cooled from 100° C. to 0° C., and wherein the donor polymer comprises one or more repeating units of the formulae:

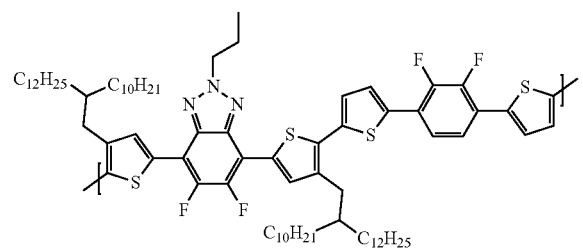

and wherein the molecular acceptors comprise:

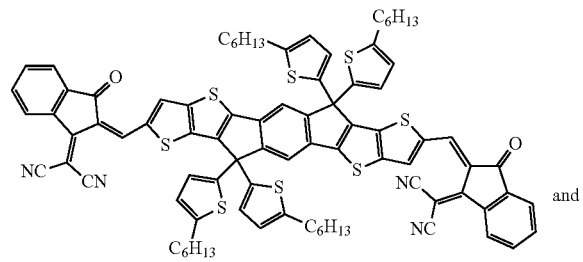

(ITIC-Th)

and

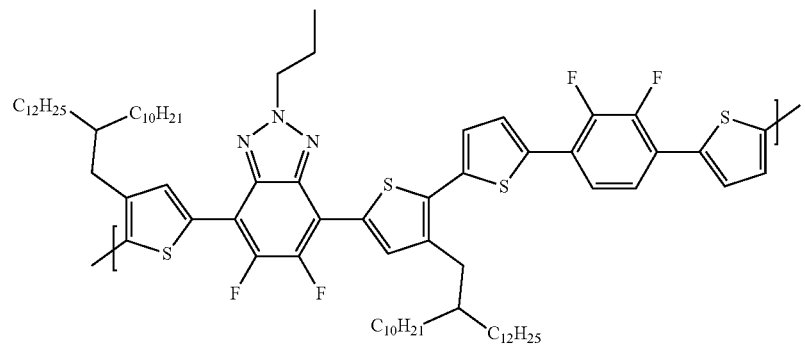

(IEIC-Th)

2. A ternary organic solar cell comprising a photoactive layer that comprises one donor polymer, and two non-fullerene molecular acceptors,
wherein the donor polymer exhibits temperature dependent aggregation (TDA) properties in solution, and
wherein the donor polymer comprises one or more repeating units of and wherein the two non-fullerene molecular accepter acceptors comprise

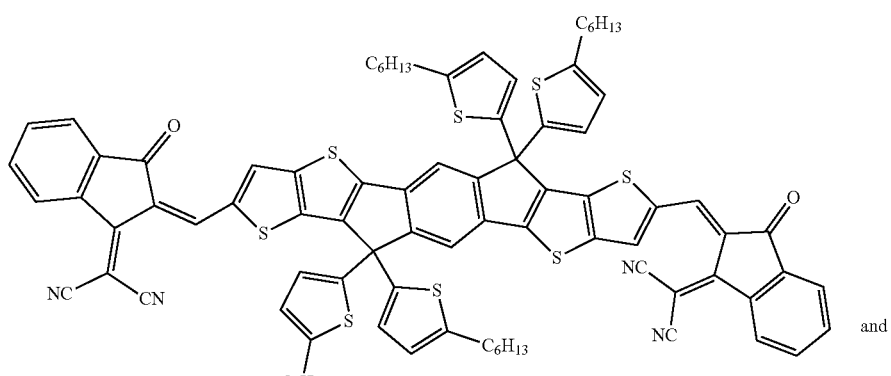

(ITIC-Th)

and

-continued
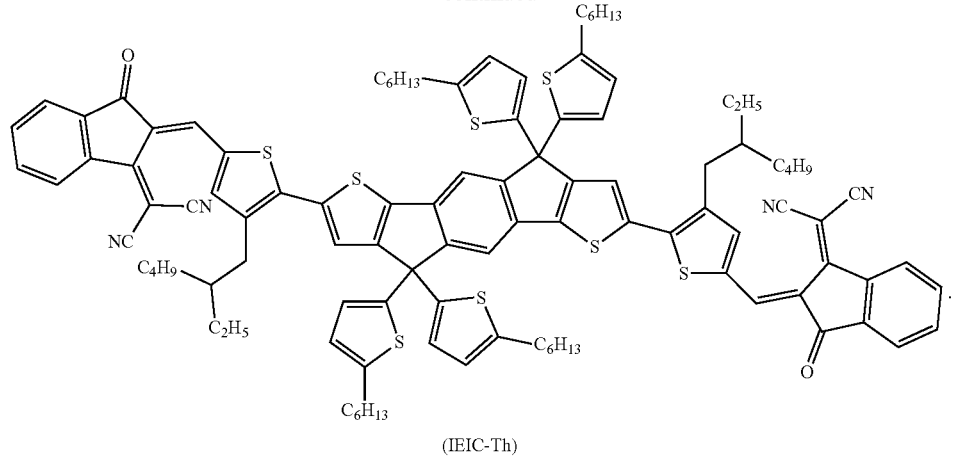
(IEIC-Th)
* * * * *

UNITED STATES PATENT AND TRADEMARK OFFICE
CERTIFICATE OF CORRECTION

| | | |
|---|---|---|
| PATENT NO. | : 12,415,885 B2 | |
| APPLICATION NO. | : 16/340552 | |
| DATED | : September 16, 2025 | |
| INVENTOR(S) | : He Yan and Kui Jiang | |

It is certified that error appears in the above-identified patent and that said Letters Patent is hereby corrected as shown below:

In the Claims

Claim 1, Column 82, Line 54, please delete the phrase "the formulae".

Claim 2, Column 84, Lines 22-23, please delete the phrase "and wherein the two non-fullerene molecular acceptor acceptors comprise" and replace with "the two non-fullerene molecular acceptors comprise".

Signed and Sealed this
Twenty-eighth Day of October, 2025

John A. Squires
*Director of the United States Patent and Trademark Office*